(12) United States Patent
Mobley et al.

(10) Patent No.: US 11,646,246 B2
(45) Date of Patent: May 9, 2023

(54) METHOD OF FABRICATING A GLASS SUBSTRATE WITH A PLURALITY OF VIAS

(71) Applicant: SAMTEC INC., New Albany, IN (US)

(72) Inventors: Tim Mobley, New Albany, IN (US); Roupen Leon Keusseyan, New Albany, IN (US)

(73) Assignee: SAMTEC, INC., New Albany, IN (US)

( * ) Notice: Subject to any disclaimer, the term of this patent is extended or adjusted under 35 U.S.C. 154(b) by 221 days.

(21) Appl. No.: 16/461,970

(22) PCT Filed: Nov. 17, 2017

(86) PCT No.: PCT/US2017/062224
§ 371 (c)(1),
(2) Date: May 17, 2019

(87) PCT Pub. No.: WO2018/094168
PCT Pub. Date: May 24, 2018

(65) Prior Publication Data
US 2019/0326130 A1 Oct. 24, 2019

Related U.S. Application Data

(60) Provisional application No. 62/424,282, filed on Nov. 18, 2016, provisional application No. 62/424,214, (Continued)

(51) Int. Cl.
*H01L 29/40* (2006.01)
*H01L 29/06* (2006.01)
(Continued)

(52) U.S. Cl.
CPC .............. *H01L 23/481* (2013.01); *C03C 4/14* (2013.01); *C03C 8/04* (2013.01); *C03C 8/18* (2013.01);
(Continued)

(58) Field of Classification Search
CPC ..... H01L 23/481; H01L 23/486; H01L 23/15; H01L 23/49827; H01L 23/49883;
(Continued)

(56) References Cited

U.S. PATENT DOCUMENTS

| 3,561,110 A | 2/1971 | Feulner et al. |
| 4,954,313 A | 9/1990 | Lynch |

(Continued)

FOREIGN PATENT DOCUMENTS

| CN | 1645560 A | 7/2005 |
| CN | 1853262 | 10/2006 |

(Continued)

OTHER PUBLICATIONS

Nomura et al., "Application of l-structure though-glass interconnect filled with submicron gold particles to a hermetic sealing device", Journal of Micromechanics and Microengineering, 2016, 26, 105018, 7 pages.

(Continued)

*Primary Examiner* — Alonzo Chambliss
(74) *Attorney, Agent, or Firm* — BakerHostetler

(57) ABSTRACT

Pastes are disclosed that are configured to coat a passage of a substrate. When the paste is sintered, the paste becomes electrically conductive so as to transmit electrical signals from a first end of the passage to a second end of the passage that is opposite the first end of the passage. The metallized paste contains a lead-free glass frit, and has a coefficient of thermal expansion sufficiently matched to the substrate so as to avoid cracking of the sintered paste, the substrate, or both, during sintering.

19 Claims, 13 Drawing Sheets

Related U.S. Application Data filed on Nov. 18, 2016, provisional application No. 62/424,262, filed on Nov. 18, 2016.

(51) Int. Cl.

| | | |
|---|---|---|
| H01L 23/48 | (2006.01) | |
| H01L 21/00 | (2006.01) | |
| H01K 3/10 | (2006.01) | |
| H01L 23/15 | (2006.01) | |
| H01L 23/498 | (2006.01) | |
| H05K 3/40 | (2006.01) | |
| H05K 3/46 | (2006.01) | |
| H05K 3/10 | (2006.01) | |
| H01L 21/48 | (2006.01) | |
| C03C 4/14 | (2006.01) | |
| C03C 8/04 | (2006.01) | |
| C03C 8/18 | (2006.01) | |
| H01B 1/22 | (2006.01) | |
| H05K 1/16 | (2006.01) | |
| H05K 1/03 | (2006.01) | |
| H05K 1/09 | (2006.01) | |
| H05K 3/42 | (2006.01) | |
| H05K 3/00 | (2006.01) | |
| H01L 23/367 | (2006.01) | |

(52) U.S. Cl.
CPC .............. H01B 1/22 (2013.01); H01L 21/486 (2013.01); H01L 23/15 (2013.01); H01L 23/49827 (2013.01); H01L 23/49883 (2013.01); H05K 3/101 (2013.01); H05K 3/102 (2013.01); H05K 3/107 (2013.01); H05K 3/4061 (2013.01); H05K 3/4076 (2013.01); H05K 3/4614 (2013.01); H05K 3/4629 (2013.01); C03C 2204/00 (2013.01); C03C 2205/00 (2013.01); H01L 23/367 (2013.01); H01L 23/49816 (2013.01); H01L 23/49833 (2013.01); H01L 23/49838 (2013.01); H05K 1/0306 (2013.01); H05K 1/095 (2013.01); H05K 1/097 (2013.01); H05K 1/16 (2013.01); H05K 1/162 (2013.01); H05K 1/167 (2013.01); H05K 3/0029 (2013.01); H05K 3/403 (2013.01); H05K 3/423 (2013.01); H05K 2201/0272 (2013.01); H05K 2201/0391 (2013.01); H05K 2201/068 (2013.01); H05K 2201/09254 (2013.01); H05K 2201/09836 (2013.01); H05K 2201/09854 (2013.01); H05K 2201/1006 (2013.01); H05K 2203/0182 (2013.01); H05K 2203/107 (2013.01); H05K 2203/1126 (2013.01); H05K 2203/1131 (2013.01); H05K 2203/1461 (2013.01); H05K 2203/1476 (2013.01)

(58) Field of Classification Search
CPC ........ H01L 21/76898; H01L 23/49822; H01B 1/22; C03C 4/14; C03C 8/04; C03C 8/18; H05K 3/101; H05K 3/102; H05K 3/107; H05K 3/4061; H05K 3/4076; H05K 3/4614; H05K 3/4629
See application file for complete search history.

(56) References Cited

U.S. PATENT DOCUMENTS

| | | | |
|---|---|---|---|
| 8,411,459 B2 | 4/2013 | Yu et al. | |
| 8,584,354 B2 * | 11/2013 | Cornejo | C03C 15/00 29/852 |
| 9,184,064 B1 | 11/2015 | Mobley et al. | |
| 9,236,274 B1 * | 1/2016 | Mobley | C03B 25/025 |
| 9,374,892 B1 | 6/2016 | Mobley et al. | |
| 9,691,634 B2 * | 6/2017 | Koelling | H01L 23/49827 |
| 9,832,867 B2 | 11/2017 | Day et al. | |
| RE47,624 E | 10/2019 | Tang et al. | |
| 10,593,562 B2 * | 3/2020 | Koelling | B22F 1/025 |
| 10,727,084 B2 | 7/2020 | Koelling et al. | |
| 11,107,702 B2 * | 8/2021 | Koelling | B22F 3/15 |
| 2001/0033891 A1 | 10/2001 | Ami et al. | |
| 2003/0017687 A1 | 1/2003 | Hembree | |
| 2003/0105211 A1 | 6/2003 | Tsui et al. | |
| 2004/0119593 A1 | 6/2004 | Kuhns | |
| 2004/0217455 A1 | 11/2004 | Shiono et al. | |
| 2005/0064707 A1 | 3/2005 | Sinha | |
| 2005/0133903 A1 | 6/2005 | Palanduz | |
| 2006/0255480 A1 | 11/2006 | Casey et al. | |
| 2007/0032078 A1 | 2/2007 | Casey et al. | |
| 2007/0060970 A1 | 3/2007 | Burdon et al. | |
| 2007/0221404 A1 | 9/2007 | Das et al. | |
| 2009/0083977 A1 | 4/2009 | Hanke et al. | |
| 2012/0131958 A1 | 5/2012 | Shimoi et al. | |
| 2012/0267774 A1 | 10/2012 | Ewe et al. | |
| 2012/0286416 A1 | 11/2012 | Sato et al. | |
| 2012/0313198 A1 | 12/2012 | Ittel et al. | |
| 2012/0314384 A1 * | 12/2012 | Woychik | H01L 23/481 361/752 |
| 2013/0029092 A1 | 1/2013 | Wakioka | |
| 2013/0105211 A1 | 5/2013 | Mobley | |
| 2013/0119555 A1 | 5/2013 | Sundaram et al. | |
| 2013/0313687 A1 | 11/2013 | Bonkohara et al. | |
| 2014/0009898 A1 | 1/2014 | Yamamoto | |
| 2014/0070148 A1 | 3/2014 | Kim et al. | |
| 2014/0104288 A1 * | 4/2014 | Shenoy | H01F 41/041 345/531 |
| 2014/0110153 A1 | 4/2014 | Kashiwagi et al. | |
| 2014/0220239 A1 | 8/2014 | Labranche | |
| 2014/0306350 A1 * | 10/2014 | Urruti | B81C 1/00095 257/774 |
| 2014/0332067 A1 | 11/2014 | Graddy et al. | |
| 2015/0076711 A1 * | 3/2015 | Blanchard | H01L 23/481 257/774 |
| 2015/0181766 A1 | 6/2015 | Lu et al. | |
| 2015/0194546 A1 | 7/2015 | Sun | |
| 2016/0059359 A1 * | 3/2016 | Krueger | B23K 26/0006 65/29.1 |
| 2016/0128201 A1 | 5/2016 | Ciufo et al. | |
| 2016/0163890 A1 | 6/2016 | Yeh et al. | |
| 2016/0163891 A1 | 6/2016 | Yeh et al. | |
| 2016/0163892 A1 | 6/2016 | Yeh et al. | |
| 2016/0163893 A1 | 6/2016 | Yeh et al. | |
| 2016/0163894 A1 | 6/2016 | Yeh et al. | |
| 2016/0163895 A1 | 6/2016 | Yeh et al. | |
| 2016/0218056 A1 * | 7/2016 | Lu | H01L 23/49827 |
| 2016/0293451 A1 | 10/2016 | Koelling | |
| 2018/0144951 A1 | 5/2018 | Koelling et al. | |
| 2018/0344245 A1 | 12/2018 | Knickerbocker et al. | |
| 2019/0304877 A1 * | 10/2019 | Mobley | C03C 8/18 |
| 2019/0322572 A1 * | 10/2019 | Mobley | H01L 23/481 |
| 2019/0326130 A1 | 10/2019 | Mobley et al. | |

FOREIGN PATENT DOCUMENTS

| | | |
|---|---|---|
| CN | 101176203 A | 5/2008 |
| CN | 102412197 A | 4/2012 |
| CN | 102870167 A | 1/2013 |
| CN | 102915949 | 2/2013 |
| CN | 103262174 A | 8/2013 |
| CN | 103430240 A | 12/2013 |
| CN | 102017818 B | 7/2014 |
| CN | 104332447 A | 2/2015 |
| EP | 1419990 A2 | 5/2004 |
| JP | 06-021655 A | 1/1994 |
| JP | 06-188561 A | 7/1994 |
| JP | 2006-147971 A | 6/2006 |
| JP | 2010-221573 A | 10/2010 |
| JP | 2011-178642 A | 9/2011 |
| JP | 2013-165265 A | 8/2013 |
| JP | 5554838 B2 | 7/2014 |

(56) References Cited

FOREIGN PATENT DOCUMENTS

| | | |
|---|---|---|
| JP | 2014-207452 A | 10/2014 |
| KR | 10-1168719 B1 | 7/2012 |
| SU | 1621192 A1 | 1/1991 |
| TW | 201344844 A | 11/2013 |
| TW | 201511037 A | 3/2015 |
| WO | 88/05959 A1 | 8/1988 |
| WO | 2009/153728 A1 | 12/2009 |
| WO | 2011/090215 A1 | 7/2011 |
| WO | 2012/061304 A1 | 5/2012 |
| WO | 2012/078335 A2 | 6/2012 |
| WO | 2012/125481 A2 | 9/2012 |
| WO | 2013/033124 A1 | 3/2013 |
| WO | 2013/138452 A1 | 9/2013 |
| WO | 2014/038326 A1 | 3/2014 |
| WO | 2014/062310 A2 | 4/2014 |
| WO | 2014/062311 A2 | 4/2014 |
| WO | 2016/051781 A1 | 4/2016 |
| WO | 2016/161434 A1 | 10/2016 |

OTHER PUBLICATIONS

Toshinori, "Developments of Sub-micron Au Particle Bonding", Tanaka Kikinzoku Kogyo K.K., 2-73, Shinmachi, Hiratsuka, Kanagawa 254-0076, Japan, Feb. 22, 2016, 19 pages.

Zhou et al., Mechanics Modelling and Numerical Simulation of Metal Power Forming Process, published Feb. 28, 2011, pp. 221.

\* cited by examiner

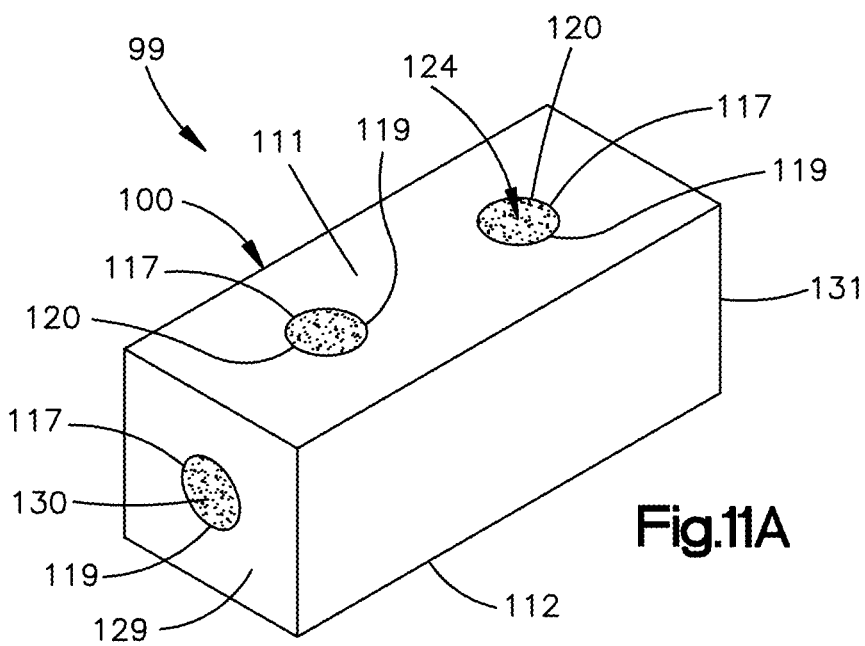
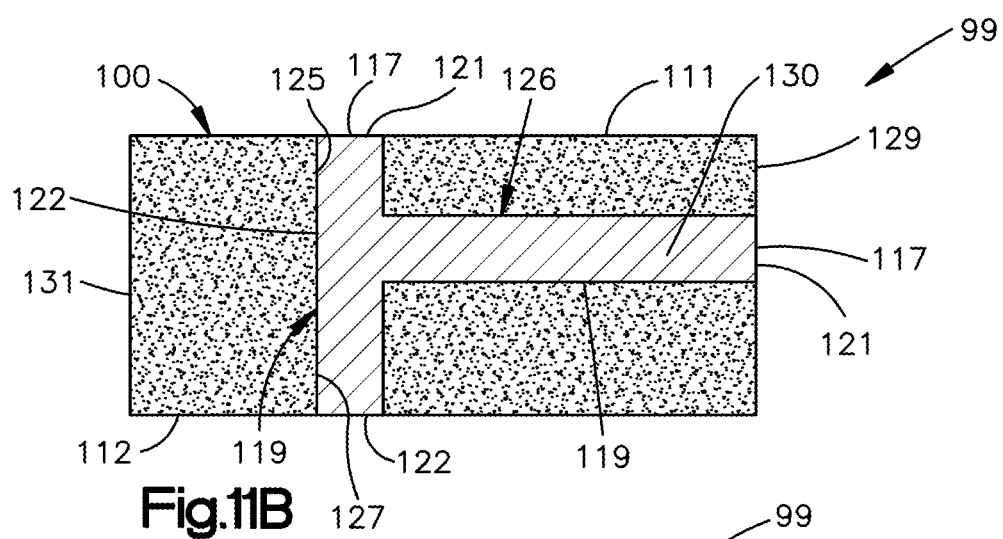
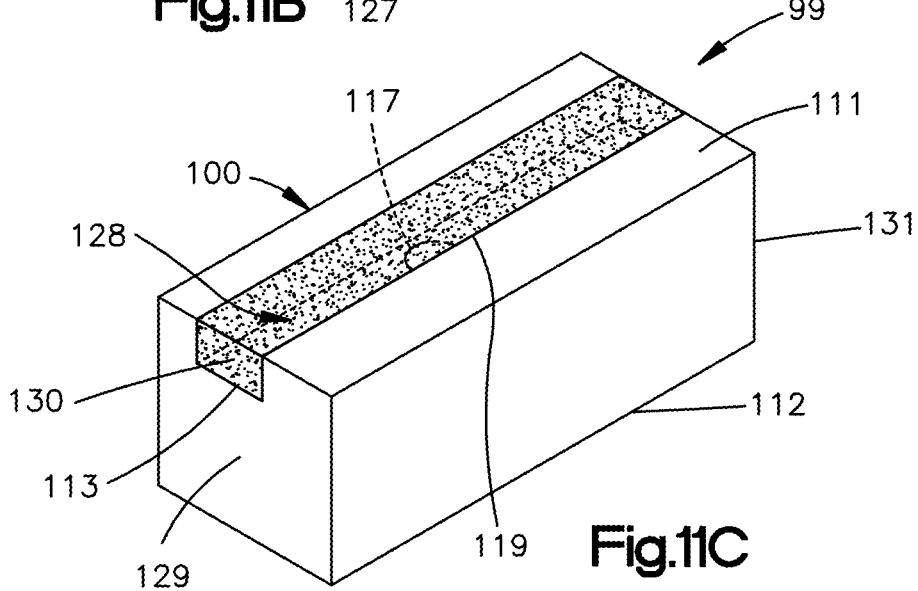

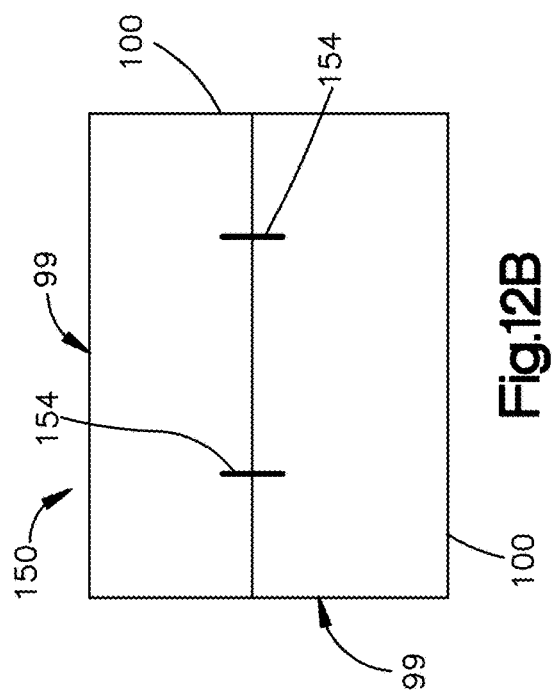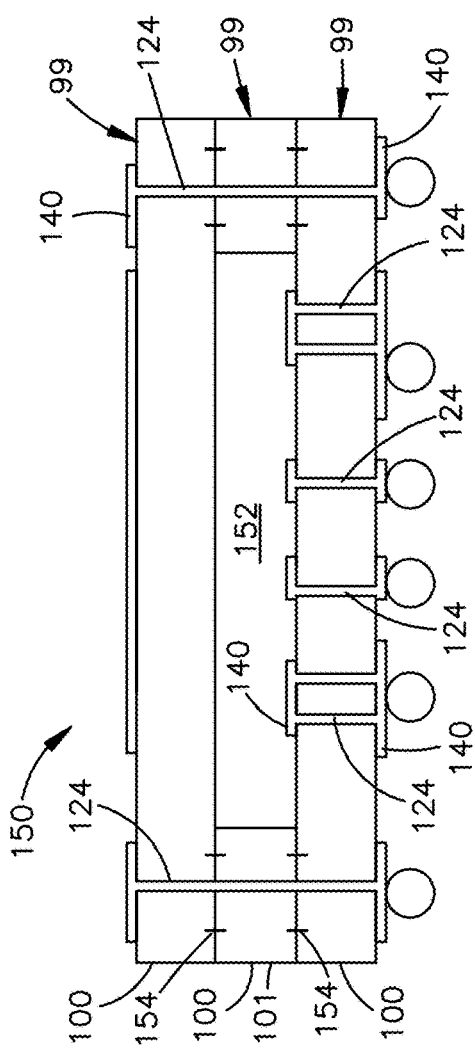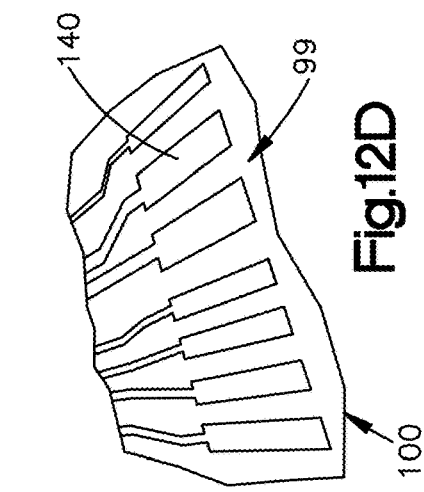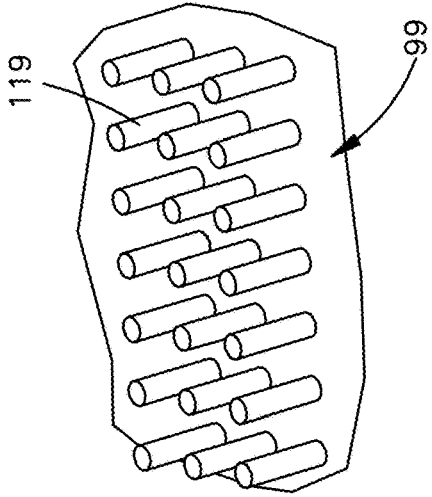

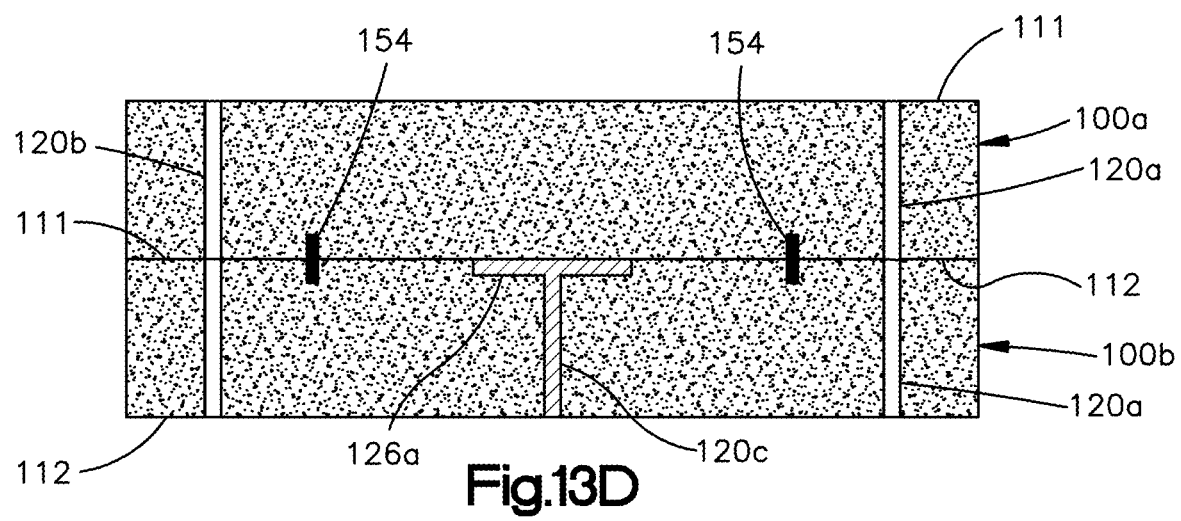
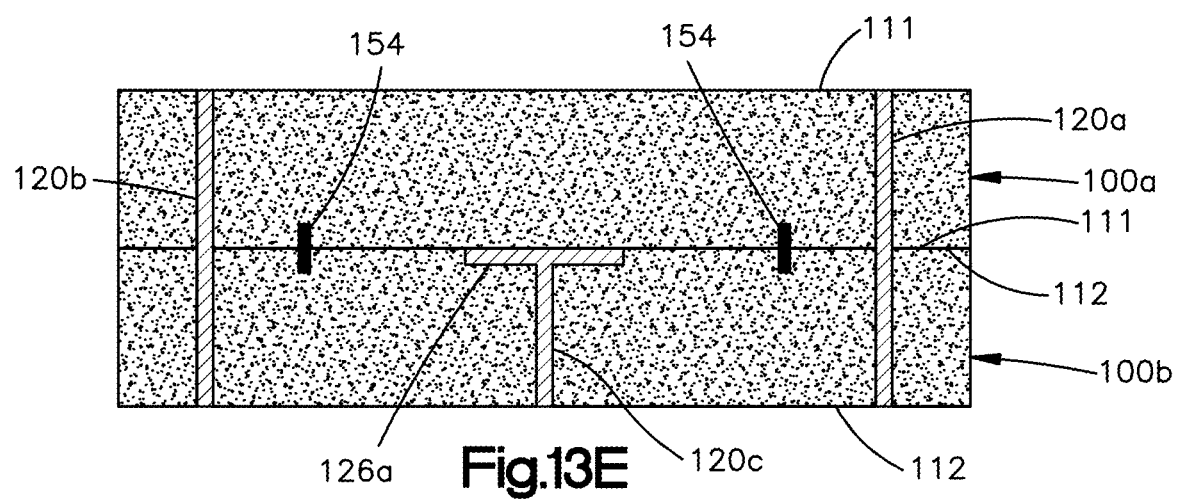
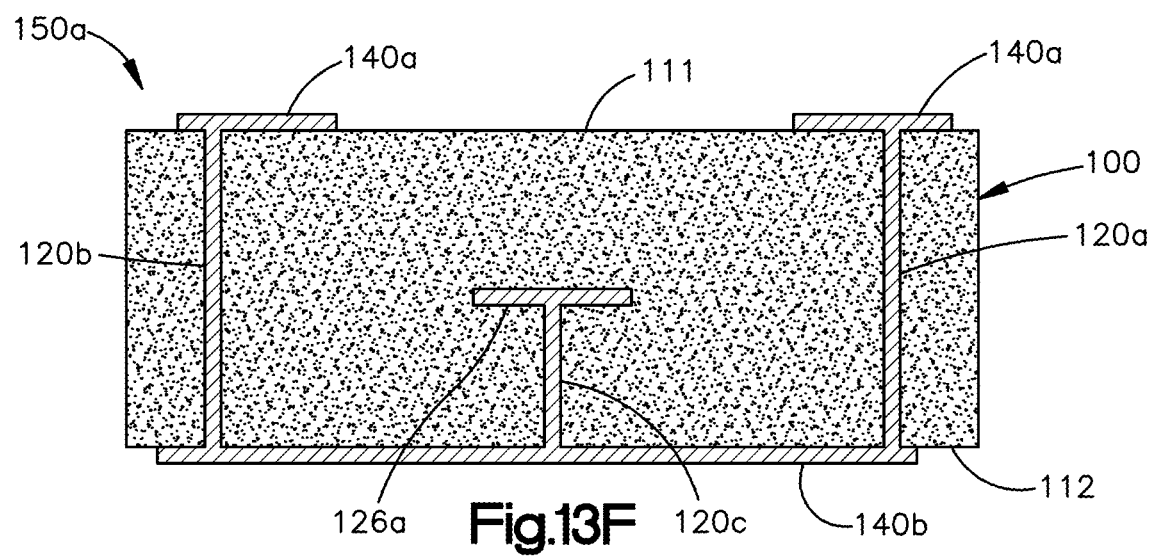

METHOD OF FABRICATING A GLASS SUBSTRATE WITH A PLURALITY OF VIAS

CROSS-REFERENCE TO RELATED APPLICATIONS

This application is the National Stage Application of International Patent Application No. PCT/US2017/062224, filed Nov. 17, 2017, which claims the benefit of U.S. patent application Ser. No. 62/424,214 filed on Nov. 18, 2016, U.S. patent application Ser. No. 62/424,262 filed on Nov. 18, 2016, and U.S. patent application Ser. No. 62/424,282 filed on Nov. 18, 2016, the disclosure of each of which is hereby incorporated by reference as if set forth in its entirety herein.

FIELD OF THE DISCLOSURE

The present disclosure relates to a method of creating passages in substrates and filling the passages with materials to connect integrated circuits for use in electronic applications.

BACKGROUND

Semiconductor devices are constantly responding to the market demand for faster, smaller, higher data and less expensive devices. Devices are expected to deliver more functionality at greater speeds in smaller dimensions and with capabilities of electrical and optical signals. This requires a new packaging scheme that can integrate heterogeneous devices such as logic, memory, power, graphics, sensors and other integrated circuits and components in a single package where improved electrical performance is also achieved by having these devices in close proximity.

Microscopic through-holes in a glass substrate are filled with materials that are usually metallized, and can act as electrical connectors between the top and bottom surface of the glass substrate to transfer electronic signals and currents to semiconductor or other devices. Glass and glassy substrates include borosilicate, quartz, sapphire, and other substrates with, toughness, pressure sensitivity, thermal expansion, dielectric properties and transparency designed for specific applications.

One system for metallized glass substrate is disclosed in U.S. Pat. No. 9,374,892, the disclosure of which is hereby incorporated by reference as if set forth in its entirety herein. Another system for metallizing glass substrates is disclosed in U.S. Pat. No. 9,691,634, the disclosure of which is hereby incorporated by reference as if set forth in its entirety herein.

SUMMARY

The present disclosure features a method of processing a substrate for use in semi-conductor applications. In some embodiments, the method comprises filling passages of the substrate with a metallized paste material using thick film technology, planarizing the substrate after metallization to clean and flatten a surface of the substrate, coating the surface of the substrate with at least one redistribution layer of a metal, a metal oxide, an alloy, a polymer, or a combination thereof.

The present disclosure also features a method of creating passages in a substrate. In some embodiments, the method comprises strengthening the substrate to increase durability during the creation of the passages and subsequent processes, treating a surface of the substrate with a protective layer, creating the passage in the substrate, and heat treating the substrate to repair damage from the passages creation process.

In some embodiments, the method comprises barrel-coating the passages with at least one layer, curing the coated passages, metallization of the passages and heat treating the substrate. In some embodiments, the method further comprises strengthening the substrate and/or heat treating to relieve stresses prior to barrel-coating to increase durability. In some embodiments, the method further comprises cleaning the substrate prior to filling.

In some embodiments, a paste material is used for filling a passage for improved adhesion, conductivity, and hermeticity in substrates. In some embodiments, the paste material comprises a metal, a glass frit composition, a solvent, a resin, and inert additives. The paste material can include conductive metals, glass frit compositions, solvents, resins, and inert additives.

The passages can be configured as through-passages, blind passages, buried passages, or combinations thereof. The passages can be passages internal to the substrate, passages defined by an external surface of the substrate, or can include both internal passages and passages defined by an external surface of the substrate. The passages can be configured as holes that extend along a vertical direction, channels that extend along a direction perpendicular to the vertical direction, or can include both vertical passages and the perpendicular passages. Alternatively or additionally, the passages can include passages that extend oblique to both the vertical direction and the direction that is perpendicular to the vertical direction. One or more of the passages can be substantially linear along their respective lengths. Alternatively or additionally, one or more of the passages can be curved along at least a portion up to an entirety of their respective lengths.

BRIEF DESCRIPTION OF THE DRAWINGS

Any feature or combination of features described herein are included within the scope of the present disclosure provided that the features included in any such combination are not mutually inconsistent as will be apparent from the context, this specification, and the knowledge of one of ordinary skill in the art. Additional advantages and aspects of the present disclosure are apparent in the following detailed description and claims, and the following drawings in which:

FIGS. 10A-10E FIG. 10 shows a schematic of alternative embodiments of a filled-through hole in accordance with the present disclosure;

FIG. 11A is a schematic perspective view of a substrate constructed in accordance with an embodiment of the present disclosure;

FIG. 11B is a schematic sectional side elevation view of a substrate constructed in accordance with an embodiment of the present disclosure;

FIG. 11C is a schematic perspective view of a substrate having a recess constructed in accordance with an embodiment of the present disclosure;

FIG. 12A is a schematic sectional side elevation view of a system that includes a plurality of substrates joined to each other;

FIG. 12B is a cross-sectional view of a weld seam at an interface between ones of the substrates illustrated in FIG. 12A;

FIG. 12C is an enlarged perspective view of vias of the structure illustrated in FIG. 12A; and FIG. 12D is a perspective view of a portion of the structure illustrated in FIG. 12A

FIG. 13D is a schematic sectional side elevation view the first and second substrates illustrated in FIG. 13C, showing the first and second substrates attached to each other;

FIG. 13E is a schematic sectional side elevation view the first and second substrates illustrated in FIG. 13D, showing through-holes of the conductive component metalized; and FIG. 13F is a schematic sectional side elevation view of a conductive component similar to FIG. 13A, but including a single homogenous monolithic substrate in accordance with one example.

DETAILED DESCRIPTION

Figure 1:
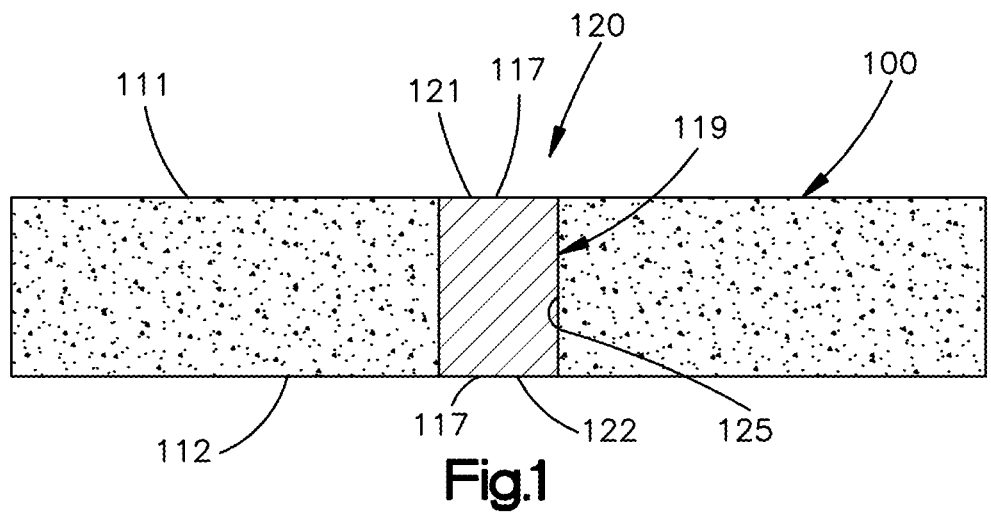
FIG. 1 is a cross-sectional view of a substrate and filled through-hole in accordance with one embodiment.

The present disclosure recognizes that certain applications for metallized substrates can benefit when the metallized substrates are biocompatible. Accordingly, the metallized substrates constructed in accordance with certain examples of the disclosure set forth below can be lead-free. The present inventors have discovered that lead interacts with metallic particles, such as copper, to produce a sufficiently electrically conductive paste that can be sintered at sufficiently low temperatures to avoid compromising the integrity of the substrate. The present disclosure provides a lead-free paste that provides the low sintering temperatures and sufficient electrical conductivity.

Creating Through-Holes

As used herein, the word "hole" and "through-hole" are used interchangeably. As used herein, the term "substantially" is defined as being largely that which is specified. As used herein, the term "partially" is defined as being to some extent, but no wholly, that which is specified. As used herein, the term "completely" is defined as being wholly or entirely that which is specified.

Referring now to FIGS. 1-11H, the present disclosure features a method of creating through-holes in a substrate. The substrate can be a glass substrate. In some embodiments, the method comprises strengthening the glass substrate to increase durability during the hole creation and subsequent processes, treating a surface of the glass substrate with a protective layer, creating the hole in the glass substrate, and heat treating the glass substrate to repair damage from the hole creation process. The glass substrate can be made from borosilicate. In another example, the glass substrate can be made of quartz. Alternatively still, the glass substrate can be made from one or more up to all of borosilicate, aluminasilicate, and quartz including single-crystal quartz, and synthetic quartz. The glass substrate can alternatively be made of any suitable alternative glass substrate materials or combinations thereof. Alternatively still, the substrate can be made of sapphire, silicon, zinc oxide, zirconium oxide, including yttria-stabilized zirconium oxide, ceramic, or combinations thereof. In certain examples, the glass substrate can be lead-free, meaning that the glass substrate can be free of lead including lead oxides, lead alloys, lead compounds, and all lead constituents. In one example, the substrate can have a coefficient of thermal expansion from about 0.05 ppm per degree centigrade to about 15 ppm per degree centigrade. It should be appreciated from the description herein that the substrate can be metalized using lead-free pastes described herein at temperatures above 400 degrees centigrade.

The term "lead-free," "free of lead," and derivatives thereof can mean that means that the quantity of lead is in accordance with the Restfriction of Hazardous Substances Directive (RoHS) specifications. In one example, the term "lead-free," "free of lead," and derivatives thereof can mean that means that the quantity of lead is less than 0.1% by weight. Alternatively or additionally, the term "lead-free," "free of lead," and derivatives thereof can mean that means that the quantity of lead is less than 0.1% by volume. In another example, the term "lead-free," "free of lead," and derivatives thereof can mean that means that the quantity of lead is less than 100 parts per million (ppm).

In some embodiments, the glass substrate is strengthened by heating the glass substrate. In some embodiments, the heat treated by annealing the glass substrate.

In some embodiments, the protective layer catches debris and protects the surface during creation of the hole. In some embodiments, the protective layer is printed, laminated, sprayed or spin coated onto the glass substrate. In some embodiments, the protective layer comprises an organic material, such as Emulsitone or an equivalent material. In some embodiments, the protective layer is a polymer coating or a paste.

In some embodiments, the hole is created by etching the glass substrate. In some embodiments, the hole is dry etched into the glass substrate. In some embodiments, the hole is wet etched into the glass substrate. In some embodiments, the protective layer is a photopolymer, a photoresist, or a deposited material or compound such as Silicon Nitride, chromium, tungsten, and gold, and combinations thereof, which have all been imaged. In some embodiments, a portion of the protective layer is exposed to ultraviolet light to harden the photopolymer and prevent the hardened photopolymer from being etched or reversed based on positive or negative photoresist type. In some embodiments, the protective layer is developed to create holes on the surface of the glass substrate. In some embodiments, the hole is etched at least partially through the glass substrate thickness. In some embodiments, the hole is etched at completely through the glass substrate thickness. In some embodiments, the photopolymer is removed by a chemical solution after the hole is created. In some embodiments, the protective layer is applied to both sides of a glass wafer for purposes of etching holes in the glass.

In some embodiments, the hole is created by a laser. In some embodiments, the laser is applied to the surface of the glass substrate. In some embodiments, a wavelength of the laser is between 45 nm and 24 .mu.m. In some embodiments, a pulse duration of the laser is between 1 femto second to 120 nanosecond. In some embodiments, the laser-created hole is chemically etched prior to filling. In some embodiments, a coating is applied to a glass surface prior to laser processing. In some embodiments, the coating comprises a polymer, film or paste which absorbs the wavelength of the laser, thereby reducing the level of heat required to create the hole in the glass. In some embodiments, the coating is subsequently removed after hole creation, either chemically, mechanically, or via megasonic and/or-ultrasonic vibration. The shape of the hole usually depends on the method and parameters used to create the hole.

In another embodiment, one or more passages can be created in the substrate using in-volume selective laser etching (ISLE). In particular, a laser is applied selectively to at least one region of the substrate so as to change a property of, or activate, the at least one region with respect to a remainder of the substrate. In one example, the at least one region is irradiated by the laser to produce the activated at least one region. Thus, the activated at least one region is suitable for removal of the glass in response to an etchant, whereas the remainder of the substrate is not removed in the presence of the etchant. For instance, the activated at least one region can have an etching rate that is hundreds to thousands times the etching rate of the remainder of the substrate that is not activated. Thus, the substrate can be etched with any suitable etchant to remove the substrate material from at least one region, thereby defining the passage in the substrate. For instance, the etching step can be a wet etching step. The etchant can be a potassium hydroxide or a hydrofluoric acid or a combination of either of the above and other acids that have a high rate of etching at the laser-exposed areas compared to the unexposed areas. The etchant can be heated prior to or during etching.

During irradiation, the laser can be advanced along the at least one region incrementally, such that the substrate is iteratively irradiated at locations sequentially spaced from each other. For instance, the laser can be advanced along the region at increments of 5 microns or any suitable alternative increments, including fractions thereof, suitable to change the property of the at least one region relative to the remainder of the substrate. It is recognized that the laser can be applied to any location as desired in the substrate. Thus, it should be recognized that one or both of external passages and internal passages can be created in the substrate using the ISLE process. External passages can be defined by an outermost external surface of the substrate. Internal passages can extend through at least a portion of the substrate so as to be surrounded on all sides by the substrate along a plane that is normal to the length of the passage.

Further, the passages can define a maximum cross-sectional dimension as desired. For instance, the maximum cross-sectional dimension can be as small as about 5 microns, and can range up to any suitable dimension as desired. In one example, the maximum cross-sectional dimension can range from a few microns, such as about 5 microns, to about 3000 microns, including about 100 microns, including about 400 microns, and including about 2000 microns. In one example, the region can extend to at least one external surface of the substrate at least at one location, such that the etchant can remove the at least one region defined by the laser so as to define at least one passage in the substrate, such as a plurality of passages. The etching step can further create at least one opening in the external surface of the substrate. In one example, the etching can create at least a pair of openings, which assists in the metallization of the substrate inside the passages, as described in more detail herein.

It should be appreciated, however, that the passages can be created in accordance with any suitable method as desired. For instance, as an alternative to the ISLE process, a laser source can ablate the at least one region of the substrate so as to produce one or more of the passages up to all of the passages. While both methods for creating the at least one passage can be viable, it is recognized that the ISLE process can reduce residual stresses in the substrate after formation of the passage.

Filling Through-Holes

The present disclosure features a method of filling a through hole in a glass substrate. In some embodiments, the method comprises metallization of the through hole, followed by thermal processing. In some embodiments, the method further comprises coating a sidewall of the hole with at least one layer of a paste material and thermally processing the coated hole prior to metallization. In some embodiments, the method further comprises strengthening the glass substrate prior to coating the sides of the holes for purposes of increased durability. In some embodiments, the method further comprises cleaning the glass substrate prior to filling.

In some embodiments, the glass substrate is heat treated by curing at a temperature between 40° C. and 1200° C., such as between 40° C. and 815° C. for borosolicate glass and organic laminate materials and 40° C. to 1600° C. for synthetic quartz and ceramic based materials. In some embodiments, heat treating the glass substrate achieves hermeticity and interconnection between inner and surface metallization layers.

In some embodiments, the coating on the sides of the hole is parallel to the direction of the through hole. In some embodiments, the hole is coated on the sides of the hole with an organometallic compound, such as silicon, titanium, tungsten, molybdenum, or cobalt based compounds. In some embodiments, the hole is coated on the sides of the hole with a glass rich paste. In some embodiments, the coating on the sides of the hole is done by glass wetting. In some embodiments, the coating on the sides of the hole is performed by reactive interaction with a surface of the hole. In some embodiments, the coating of the sides of the hole is thermal processed at a temperature between 40° C. and 1090° C. for borosilicate glass materials.

In some embodiments, a first layer is coated onto the side of the hole in order to promote adhesion to the substrate. In some embodiments, the subsequent layers are for conductivity and performance. In some embodiments, the performance is defined as the input and output of an electronic signal along a metallized material that extends along at least one passage of the glass substrate. In some embodiments, the performance is defined as the input and output of electrical power from a first surface of the glass substrate to a second surface of the glass substrate.

The paste material can be thermally conductive. Alternatively or additionally, the paste material can be electrically conductive. In some embodiments, the paste material comprises one or more metals or alloys, glass frit compositions, solvents, resins, conductive or non-conductive inert additives, or mixtures thereof.

For instance, the paste can include particles of additive materials. The particles of the added materials can include one or both of electrically non-conductive particles and electrically conductive particles. In one example, the additives can reduce the coefficient of thermal expansion of the paste. Alternatively or additionally, the additives can promote adhesion of the paste to the substrate. The additives can include particles of the oxides of silicon, zinc, copper and alumina, in addition to lanthanum hexaboride. Conductive additives can include a material having an electrical conductivity less than that of bulk silver and greater than that of silicon, or can be at least one of an oxide, an alloy, or a mixture of the material or an oxide or an alloy thereof. The conductive additives can further have a coefficient of thermal expansion less than that of copper and greater than 2.5 ppm per degree centigrade In some examples, the additives can include silicon, tungsten and molybdenum. The additives can include metals, their oxides, their compounds, and their mixtures. In one example, the additives can contain one or both of molybdenum and $Al_2O_3$ their oxides, their compounds, and their mixtures. In another example, the additives can include one or more up to all of Cu, Zn, Si, W, their oxides, their compounds, and their mixtures. Alternatively or additionally, the additives can include semi-conductive materials such as Silicon, its oxides, its compounds, and its mixtures. In one example, the additives can include one or more up to all of $Cu_2O$, ZnO, and $SiO_2$. Alternatively or additionally still, the additives can be non-conductive.

In some embodiments, the paste material is a thick film paste containing a glass frit and a conductor. In some embodiments, the conductor is copper, silver, nickel or gold. In some embodiments, the hole is completely plated. In some embodiments, the hole is partially plated. In some embodiments, a conductive polymer is used to completely fill the hole. In some embodiments, the conductive polymer comprises a filler metal. In some embodiments, the filler metal is a pure metal compatible with the conductor. In some embodiments, the filler metal is a coated metal compatible with the conductor in some embodiments a silicon compound or adhesion promoter is in the paste. In some embodiments, the conductive polymer is cured in a temperature range from about 40° C. to about 515° C. to cause sintering and adhesion of the conductive polymer filler metal to the conductor in the hole itself or the wall of the hole. In some embodiments, a particle size of the metal ranges from about 0.01 microns to about 24 microns for D50 (fifty percentile particle size distribution). As used herein, the term "about" can refer to plus or minus 10% of the referenced value.

In some embodiments, the hole is metallized by plating. In some embodiments, the hole is completely metallized by applying a thick film paste composition. In some embodiments, the hole is metallized by applying a partial thick film paste composition. In some embodiments, metallization completely fills the hole. In some embodiments, metallization partially fills the hole. In some embodiments, any remaining space in the hole is filled with a conductive polymer. In some embodiments, the conductive polymer comprises pure metal, coated particles or a mixture of pure and coated particles. In some embodiments, the polymer comprises a conductive metal curing material that is Cu and/or Ag and/or Au filled.

In some embodiments, the metal curing material that is thermally cured in the 40° C. to 515° C. using conductive particles with size in the 0.01 to 24 micron range for D50 (fifty percentile particle size distribution). In some embodiments, the conductive polymer is cured using UV or equivalent actinic radiation, or a combination of UV exposure and thermal, or thermal curing completely. In some embodiments, an outer surface of a conductive particle is Cu and/or Ag, and/or Au. In some embodiments, the core of the conductive particles is different compared to the outer surface.

Paste Material

The present disclosure features at least one electrically conductive material that is configured to at least partially fill at least one passage of the substrate. The at least one electrically conductive material can be lead-free, meaning that the at least one electrically conductive material can be free of lead including lead oxides, lead alloys, lead compounds, and all lead constituents. The at least one electrically conductive material can further provide improved adhesion and hermeticity in glass substrates. In some embodiments, the at least one electrically conductive material can be configured to be electroplated to the substrate inside the at least one passage as described in more detail below. It should be appreciated that the at least one electrically conductive material can be any material suitable for metallizing the substrate in the at least one passage, unless otherwise indicated.

For instance, in some embodiments, the at least one electrically conductive material can be configured as a paste. In some embodiments, the paste comprises an electrically conductive material such as a metal, a glass frit composition, a solvent, a resin, a conductive or non-conductive inert additive, or mixtures thereof. In some embodiments, the paste material comprises mixtures of metals, mixtures of glass frit compositions, mixtures of solvents, mixtures of resins, and mixtures of conductive or non-conductive inert additives. It should thus be appreciated that the paste can include a carrier, such as the solvent, resins, or mixtures thereof, and electrically conductive particles in the carrier. In some embodiments the paste material is lead-free, meaning that the paste material can be free of lead including lead oxides, lead alloys, lead compounds, and all lead constituents. Thus, the past material is usable in applications where biocompatibility is desired. Thus, it should be appreciated in some embodiments that the glass frit can also be lead-free, meaning that the glass frit can be free of lead including lead oxides, lead alloys, lead compounds, and all lead constituents.

As defined by the Department of Defense's test method standards for seals, hermeticity is the effectiveness of the seal of microelectronic and semi-conductor devices with designed internal cavities. The failure criteria for hermeticity vary depending on the application and are defined by the Department of Defense's test method standards for seals.

As defined herein, the term "improved adhesion" is metallization lift-off over about 1 Newton. Poor adhesion is metallization lift-off at or below about 1 Newton. Standard adhesion peel methods (Dupont H-02134) or wire soldering into fired pads may be included.

In some embodiments, the electrically conductive particles can define the metal. In some example, the metal can be a pure metal. In some embodiments, the metal comprises a metal compound. In some embodiments, the metal is combined with oxides and compounds of the metal and mixtures thereof. In some embodiments, the electrically conductive particles can include copper, silver, gold, platinum, nickel, tungsten, molybdenum, silicon, aluminum, zinc, barium, boron, bismuth, titanium, metal compounds, or and a combination thereof. In some examples, the powder can contain copper particles or particles of at least one of an oxide, an ally, or a mixture thereof. For instance, the powder can contain particles of copper oxide. Further, the lead-free glass frit can be substantially devoid of bismuth and oxides, alloys, and mixtures of bismuth. The term "substantially devoid" as used with respect to bismuth recognizes that the glass frit can contain trace amounts of bismuth, so long as the quantity of bismuth is not sufficient to produce brittle intermetallic compounds with copper in sufficient quantity so as to compromise the integrity of the metallized material that extends along at least one passage of the glass substrate, as is appreciated by one having ordinary skill in the art. For instance, in one example the lead-free glass frit that is substantially devoid of bismuth can contain less than 1% of bismuth by weight. Alternatively or additionally, the lead-free glass frit that is substantially devoid of bismuth can contain less than 1% of bismuth by volume. In still another example, the lead-free glass frit can be bismuth free. In one example, the glass frit can further include an oxide of at least one of silicon, aluminum, boron, zinc, barium, magnesium, lithium, potassium, and calcium, or compounds thereof.

In still other examples, the lead-free glass frit can include bismuth, and the electrically conductive powder can include electrically conductive particles that do not create brittle intermetallic compounds in the presence of bismuth. For instance, the electrically conductive particles can include gold particles or silver particles. Alternatively or additionally, the electrically conductive particles can include an oxide or an alloy of gold, or a mixture of an oxide or an alloy thereof. Alternatively or additionally, the electrically conductive particles can include an oxide or an alloy of silver, or a mixture of an oxide or an alloy thereof. For instance, the electrically conductive powder can include gold oxide particles or silver oxide particles. It should be appreciated that the term "or" when used in herein connection with more than one element is intended to include one or more of the elements up to all of the elements, unless otherwise indicated. Further, the term "or" as used herein is intended to be used synonymously with the term "at least one of" as used herein, unless otherwise indicated.

In some embodiments, the metallic electrically conductive particles are configured as a powder having a particle size that ranges from 0.01 to 24 microns for D50 (fifty percentile particle size distribution). The particle size can be measured at a maximum cross-sectional dimension of the particles. In some embodiments, the particles can be spherically shaped, such that the maximum cross-sectional dimension defines a diameter of the particles. In other example, some or all of the particles can be irregularly shaped. In some embodiments, a combination of powders with different particle sizes and shapes can be mixed for through hole filling applications. In one example the powders can be substantially spherical. For instance, the powders can be spherical.

In some embodiments, the metal comprises of a coated particle. In some embodiments, the metal comprises a conductive powder, wherein the conductive powder comprises a core, and wherein the core is coated with copper, silver, gold, platinum, nickel, tungsten, molybdenum, silicon, aluminum, zinc, barium, boron, bismuth, titanium, or a combination thereof.

In some embodiments, the glass frit composition comprises a mixture of glass frits. In some embodiments, the glass frit composition comprises the oxide and compounds of one or more of the following materials: Ag, Al, B, Bi, Ce, Cu, Co, F, PbZn, Zr, Si, Ba, Ru, Sn, Mg, Te, Ti, V, Na, K, Li, Ca, and P. In other embodiment, the glass frit composition can be lead-free, meaning that the glass frit composition can be free of lead including lead oxides, lead alloys, lead compounds, and all lead constituents. Thus, the glass frit composition can include the oxide and compounds of one or more of the following materials: Zn, Ba, B, Si, Al, Ca, Li, Na, K, V, Te, Sr, Sn, P, The particle size of the glass frit can be in the 0.01 to 24 micron range for D50 (fifty percentile particle size distribution). In some embodiments, the glass frit composition can be about 1% to about 20% of the metallized paste and comprises a mixture of glass frits by weight.

In some embodiments, the solvent comprises Terpineol, Texanol, Dowanol, butyl carbitol, butyl carbitol acetate, methyl-ethyl-butyl ethers, similar solvents used in thick film technology for curing or firing applications, or a combination thereof.

In some embodiments, the resin comprises ethyl cellulose based compositions and mixtures. In some embodiments, the resin comprises resin systems similar to ethyl cellulose based compositions and mixtures. In some embodiments, the resin is natural, synthetic or a combination thereof. The resin is normally dissolved using an appropriate solvent to produce a viscous vehicle. The viscous vehicle can have a viscosity within 20% of pure honey. The vehicle system is used to disperse the various ingredients in a thick film paste for printing, patterning and through hole filling applications.

In some embodiments, the inert additive can lower the coefficient of thermal expansion of the paste to better match that of the substrate. Alternatively or additionally, the inert additive can promote adhesion of the paste to the substrate. In one example, the inert additive can include one or more up to all of tungsten, molybdenum, aluminum, zinc, zirconium, silicon, lanthanum, ruthenium, cobalt, nickel, their compounds and oxides, or mixtures thereof.

In some embodiments, the paste material is mixed and dispersed using a three roll mill and/or other approaches, typical in thick film technology, or a combination thereof. In some embodiments, the paste material fills the hole by printing, extrusion, dispensing, coating, injection or a combination thereof. In some embodiments, the filled hole is cured and/or fired in an air, nitrogen, doped nitrogen, CO/CO2, vacuum, other inert environments or a combination of thereof to prevent or minimize oxidation of the conductive powder such as copper.

It is recognized that a single electrically conductive material, such as a paste, applied to a passage of the substrate can be suitable to achieve desired electrical properties. It is recognized in one example, that the paste as-added can be electrically non-conductive. However, after the paste is sintered, the paste can become electrically conductive. However, it is further recognized that the presence of microvoids in the substrate along the passage can be further reduced or eliminated by including electrically conductive particles having different D50 particle sizes, such that the smaller particle sizes can fill the microvoids. For instance, the paste can have two or three or more different D50 particle sizes of electrically conductive material. It is further recognized that the presence of microvoids in the passage can also be reduced or eliminated by introducing first and second conductive materials into the passage. The first and second conductive materials can be configured as first and second pastes. The first paste can occupy a middle portion of the passage, and a second paste can occupy an outer portion or outer portions of the passage that extends to an external surface of the substrate 100. The first paste can have a viscosity from about 250 Pascal Seconds (PA·S) to about 400 PA·S. The second paste can have a viscosity from about 30 PA·S to about 80 PA·S. The second paste can thus extend in the passage from the first paste to an external surface of the substrate. In one example, the second paste can metalize an outer surface of the glass after formation of the via. Thus, the second paste can have a higher density than the first paste so as to allow for metallization of the glass surface, for instance using film metallization of the glass surface, wherein the metallization o the glass surface is electrically connected to the via. It is recognized that the second paste can metallize more than one outer glass surface electrically connected to the via.

In one example, the electrically conductive particles of the first and second pastes can have different D50 particle sizes. For instance, the first paste can include first electrically conductive particles having a first D50 particle size, and the second paste can include second electrically conductive particles having a second D50 particle size. The first D50 particle size can be different than the D50 particle size of the second paste. For instance, the second D50 particle size can be smaller than the first D50 particle size. The particles of the first conductive material can have a D50 particle size that ranges from about 10 nanometers to about 2000 nanometers. The particles of the second conductive material can have a D50 particle size that ranges from about 10 nanometers to about 24 microns. Further, the particles of the first electrically conductive material can have a first D50 outer area, and the particles of the second electrically conductive material can have a second D50 outer area that is smaller than all other D50 outer areas of the first electrically conductive material. Similarly, the first D50 outer area can be greater than all other D50 outer areas of the second electrically conductive material.

Alternatively or additionally, the first and second pastes can have different densities of electrically conductive particles. In one example, the first paste can have a first density of electrically conductive particles, and the second paste can have a second density of electrically conductive particles that is greater than the first density.

Alternatively or additionally still, the first electrically conductive particles of the first paste can have the same or different chemical composition than the second electrically conductive particles of the second paste. Thus, the first paste can include a first metal, and the second paste can include a second metal different than the first metal.

Alternatively or additionally still, the first carrier (that is, at least one or both of the solvent and the resin) of the first paste can have the same or different chemical composition than the second carrier (that is, at least one or both of the solvent and the resin) of the second paste. The carrier can include one or both of an ethyl cellulose resin and a non-ethyl cellulose resin. The carrier can further include solvents, such as one or more of Texanol solvent commercially available from Eastman Chemical Company having a place of business in Kingsport, Tenn.; a terpineol solvent, and a glycol ether such as a Dowanol glycol ether commercially available from Dow Chemical having a place of business in Midland Mich.

It can be desirable to reduce or eliminate the formation of cracks that can affect electrical performance in one or both of the substrate and the conductive material. Without being bound by theory, it is believed that substantially matching the coefficients of thermal expansion of the at least one conductive material and the substrate can contribute to the reduction of elimination of the formation of such cracks. For instance, it is envisioned that the at least one conductive material can have a coefficient of thermal expansion that is within about 50% or less of the coefficient of thermal expansion of the substrate. In particular, in one example it is envisioned that the at least one conductive material can have a coefficient of thermal expansion that is within about 25% or less of the coefficient of thermal expansion of the substrate. When the conductive material includes first and second conductive materials, the first conductive material can have a first coefficient of thermal expansion, and the second lead-free electrically conductive material can have a second coefficient of thermal expansion that substantially matches the first coefficient of thermal expansion and a coefficient of thermal expansion of the substrate. In one example, the first and second coefficients of thermal expansion can be within about 25% of each other and of the coefficient of thermal expansion of the substrate. For instance, the coefficients of thermal expansion of the at least one conductive material and the substrate can ranges from about 0.01 to about 11, including from about 3 to about 5.5, including from about 4 to about 5, depending on the glass type used. Coefficients of thermal expansion disclosed herein are measured in parts per million (ppm) per degree Centigrade, unless otherwise indicated.

In one example, the paste can include silicon which has a coefficient of thermal less than the metallic material, such as copper. Thus, the can reduce the coefficient of thermal expansion of the paste to a level within 25% of that of the substrate. However, silicon is not an electrical conductor. It can be desired in some examples to reduce the coefficient of thermal expansion of the paste to a level within 25% of that of the substrate be including in the paste a material having an electrical conductivity that is greater than the electrical conductivity of silicon. Though the electrical conductivity of the material may be less than that of copper, it also has a coefficient of thermal expansion that is less than copper and greater than 2.5 per degree centigrade. Thus, the paste can include copper particles or particles of at least one of an oxide, an alloy, or a mixture of copper or an oxide or an alloy thereof, and particles of the material or at least one of an oxide, an alloy, or a mixture of the material or an oxide or an alloy thereof. In one example, the particles of the material can include zinc particles or tungsten particles or both. Alternatively or additionally, the particles of the material can include an oxide, an alloy, or a mixture of tungsten or an oxide or an alloy thereof. Alternatively or additionally, the particles of the material can include an oxide, an alloy, or a mixture of bismuth or an oxide or an alloy thereof. In another example, the particles of the material can include aluminum particles or molybdenum particles or both. Alternatively or additionally, the particles of the material can include an oxide, an alloy, or a mixture of aluminum or an oxide or an alloy thereof. Alternatively or additionally, the particles of the material can include an oxide, an alloy, or a mixture of molybdenum or an oxide or an alloy thereof. Alternatively or additionally still, the electrically conductive powder can include silicon particles or particles of at least one of an oxide, an alloy, or a mixture of silicon or an oxide or an alloy thereof.

Processing Glass Substrates

The present disclosure features a method of processing a glass substrate for use in semi-conductor packaging applications. In some embodiments, the method comprises filling through-holes of the glass substrate with a metallized paste material using thick film technology, planarizing the glass substrate after metallization to clean and flatten a surface of the glass substrate, coating the surface of the glass substrate with at least one redistribution layer of a metal, a metal oxide, an alloy, a polymer, or a combination thereof.

In some embodiments, the redistribution layer is a metal filled conductive polymer that is cured in the 40° C. and 515° C. temperature range. In some embodiments, the redistribution layer is plated for improved performance and functionality. In some embodiments, the plating material comprises one or a combination of materials, including Ni, Cu, Ag, Au, Pd, Pb, and Sn as major components. In other embodiments, the plating material can be lead-free, meaning that the plating material can be free of lead including lead oxides, lead alloys, lead compounds, and all lead constituents.

In some embodiments, the redistribution layer is spin-coated onto the glass surface. In some embodiments, the redistribution layer is sprayed, screened or laminated onto the glass surface. In some embodiments, the redistribution layer is deposited using thick film technology. In some embodiments, the redistribution layer is deposited using thin film technology.

In some embodiments, thick film technology uses pastes containing glass frits that are deposited in patterned layers defined by screen printing and fused at high temperature onto a glass substrate. The paste is applied onto a substrate, or through hole filled. The paste is subsequently sintered at less than about 815 degrees C. so as to cause the electrically conductive particles to sinter together, thereby causing the paste to become electrically conductive. For instance, the paste can be cured and/or fired at a sintering temperature in the range of about 40° C. and about 815° C. In one example, the firing or sintering temperature can be less than 700 degrees C. 17. In one specific example, the paste can be sintered in a temperature range having a lower limit of about 500 degrees C. and an upper limit of about 750 degrees C. The paste ingredients (for a conductor) are particles of metal, glass frit, additives, oxides, etc, dispersed in a vehicle system. Thick film processing technology is apparent to those ordinarily skilled in the art.

In some embodiments, in thin film technology, a metal is evaporated or deposited on a substrate, and then a photoresist is applied, and then exposed and developed to expose areas to be etched. The remaining deposited metallization (after etching the unwanted areas) constitutes the desired circuitry. The thin film deposited layer might contain several different metallization layers for adhesion, barrier and passivation. In some embodiments, in thin film technology, an adhesion layer is deposited onto the glass substrate. In some embodiments, the adhesion layer is usually tungsten, titanium, chromium or a combination thereof. In some embodiments, the adhesion layer is followed by a metal layer. In some embodiments, the metal layer is copper, gold, or silver. In some embodiments, a diffusion barrier is deposited on the metal layer. In some embodiments, the diffusion barrier is nickel, tungsten, titanium, or chromium. In some embodiments, the diffusion barrier is followed by a passivation layer to protect the other layers from oxidation. In some embodiments, the passivation layer is nickel or gold. Thin film metallization technology is apparent to those ordinarily skilled in the art.

In some embodiments, the method further comprises firing the glass substrate. In some embodiments, the glass substrate is fired at a temperature between 385° C. and 1600° C. to release stresses before or after hole formation. In some embodiments, the method further comprises curing the glass substrate. In some embodiments, the glass substrate is cured at a temperature between 40° C. and 515° C.

In some embodiments, the coated surface is cured in neutral or reducing atmospheres. In some embodiments, the coated surface is cured in air, nitrogen, or in a vacuum. In some embodiments, the coated surface is cured in doped atmospheres for higher performance.

Final Product

Figure 2:
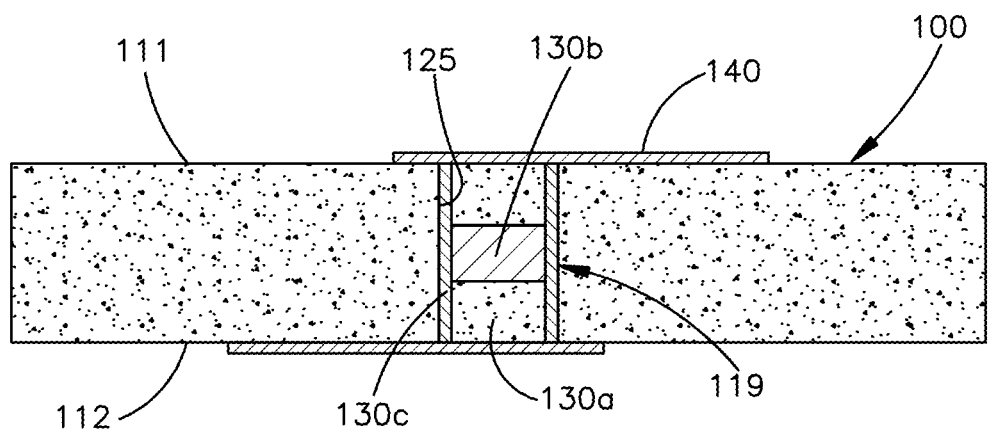
FIG. 2 is a cross-sectional view of a substrate in accordance with an alternative embodiment.
Figure 3A:
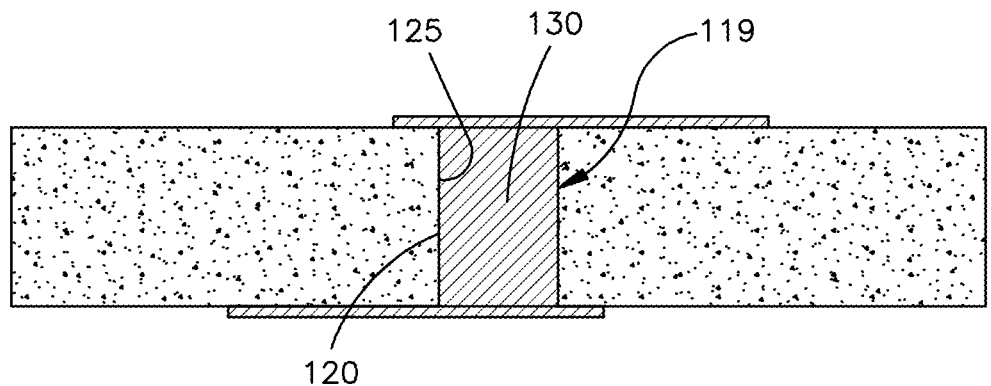
FIG. 3A is a sectional side elevation view of a substrate in accordance with one embodiment.
Figure 3B:
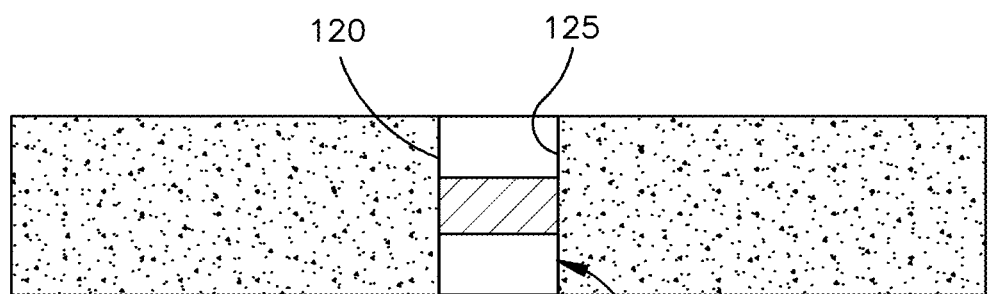
FIG. 3B is a sectional side elevation view of a substrate in accordance with one embodiment.
Figure 3C:
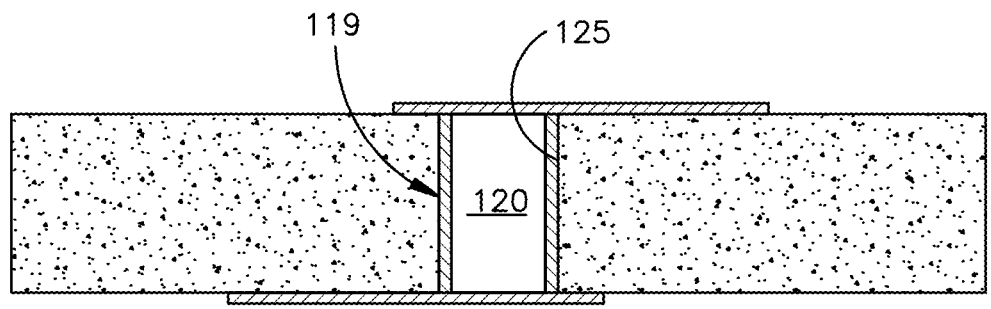
FIG. 3C is a sectional side elevation view of a substrate in accordance with one embodiment.
Figure 3D:
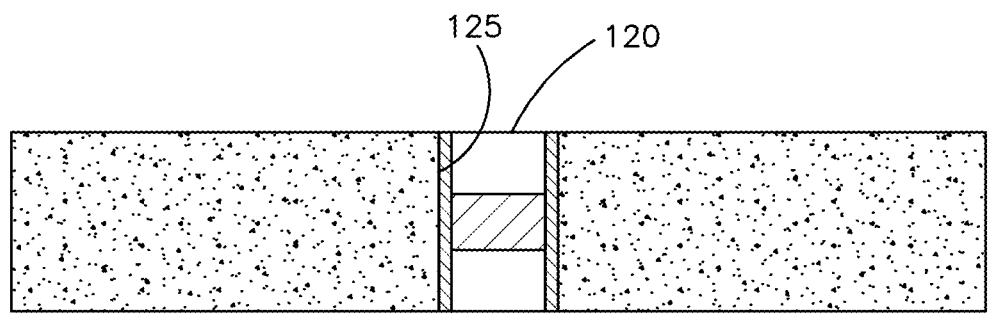
FIG. 3D is a sectional side elevation view of a substrate in accordance with one embodiment.
Figure 3E:
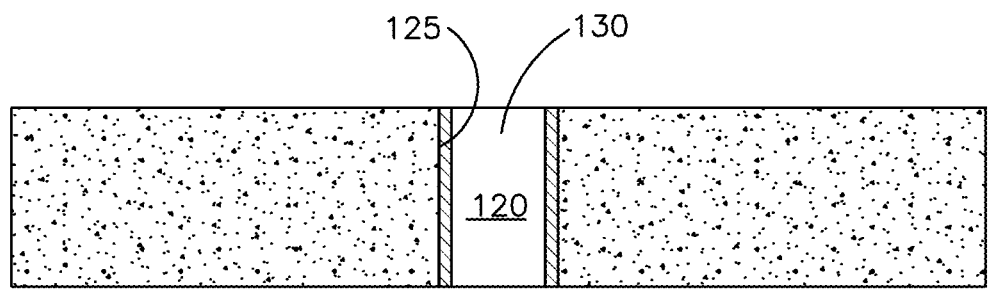
FIG. 3E is a sectional side elevation view of a substrate in accordance with one embodiment.
Figure 4:
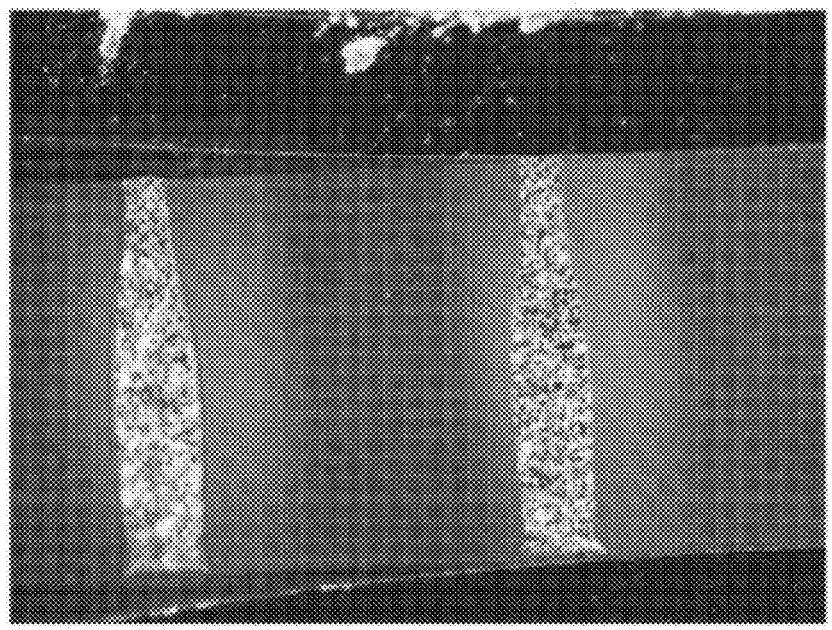
FIG. 4 is a cross-sectional view of a substrate and filled through-hole in accordance with one embodiment.
Figure 5:
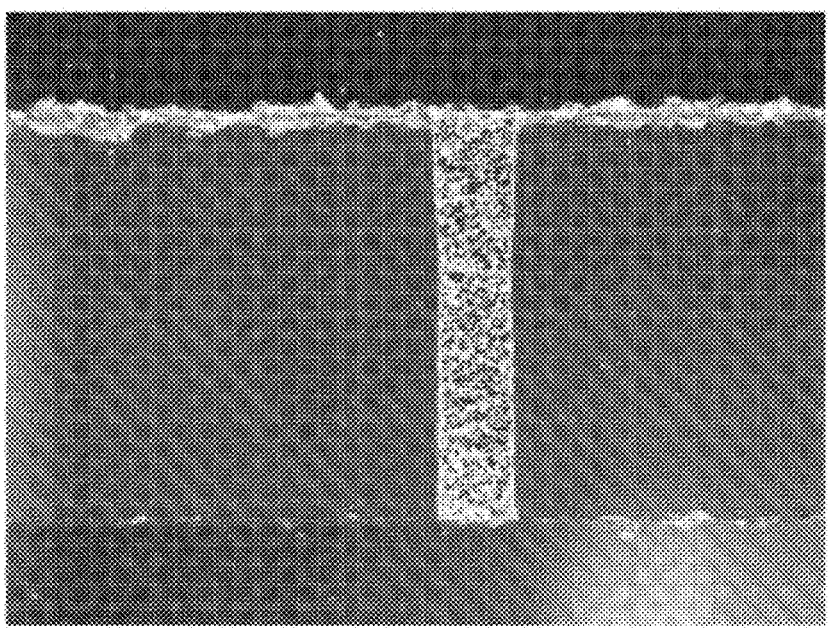
FIG. 5 is a cross-sectional view of a substrate and filled through-hole in accordance with the present disclosure.
Figure 6:
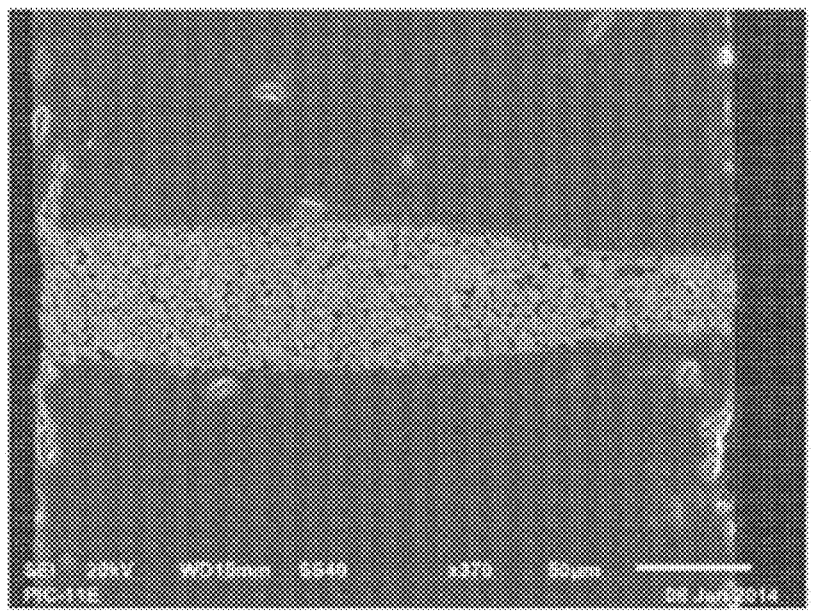
FIG. 6 is a cross-sectional view of a substrate and filled through-hole in accordance with the present disclosure.
Figure 7:
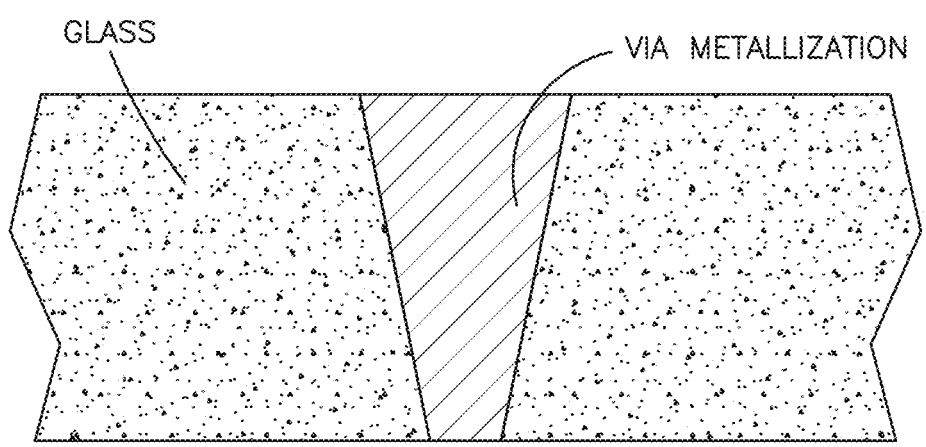
FIG. 7 shows a schematic of the cross-sectional view of a metallized through-hole in accordance with the present disclosure.
Figure 8:
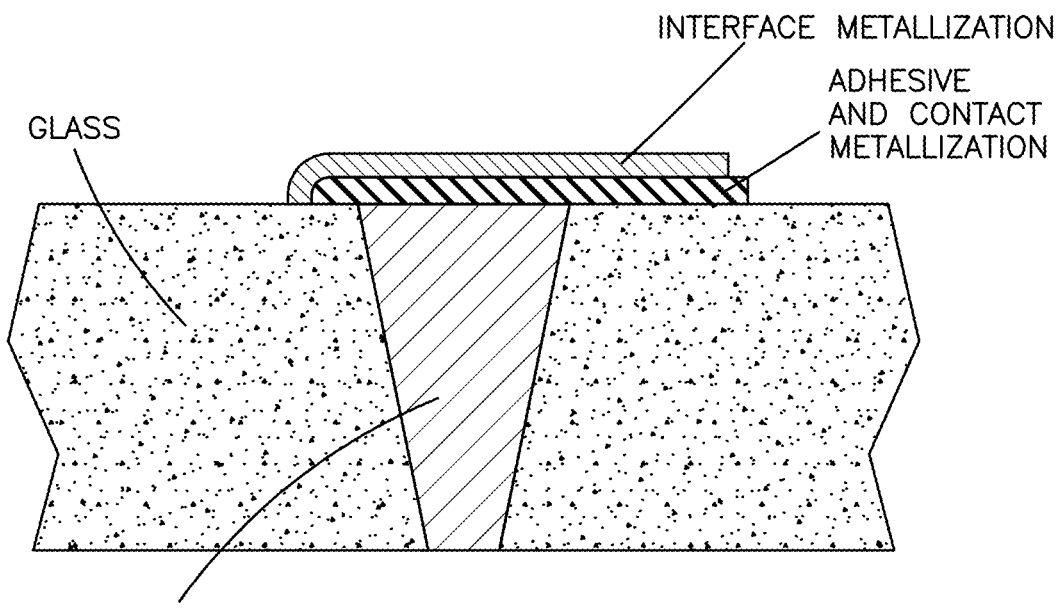
FIG. 8 shows a schematic of the cross-sectional view of redistribution layers disposed on a surface of the substrate and a metallized through-hole in accordance with the present disclosure.
Figure 9:
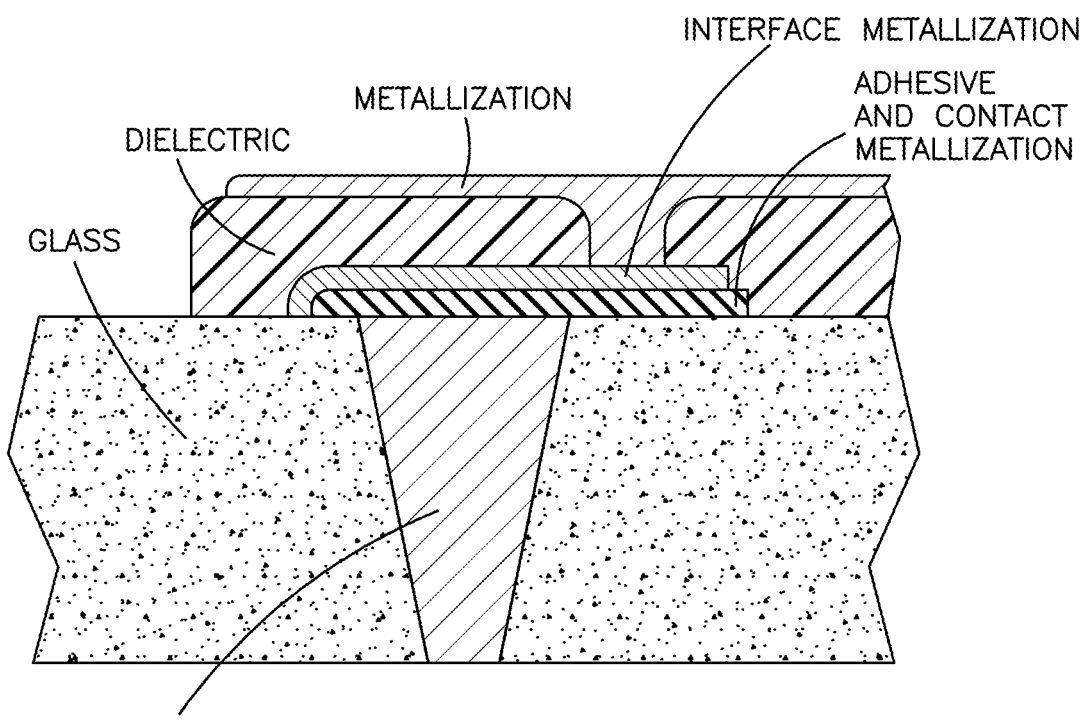
FIG. 9 shows a schematic of the cross-sectional view of redistribution layers disposed on a surface of the substrate and a metallized through-hole in accordance with the present disclosure.
Figure 10A:
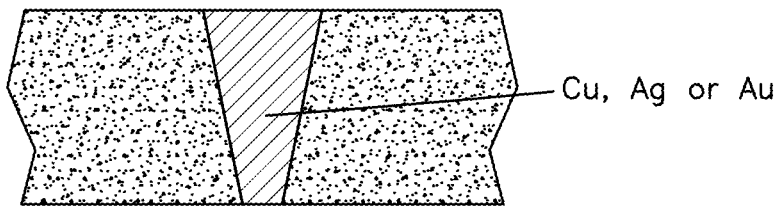
Figure 10B:
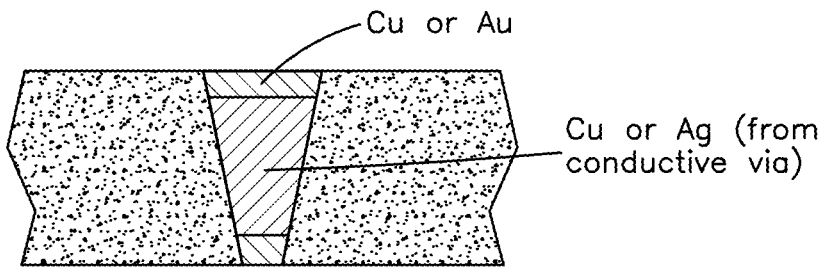
Figure 10C:
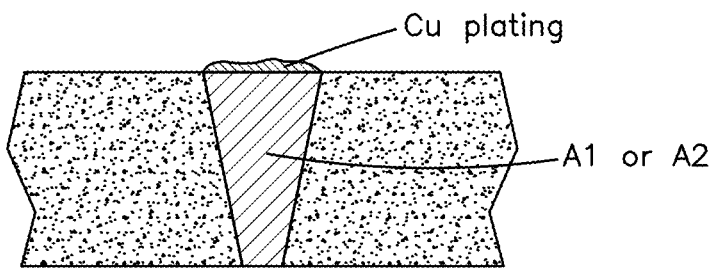
Figure 10D:
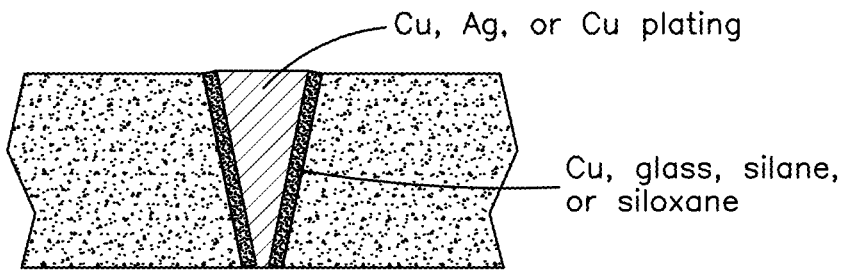
Figure 10E:
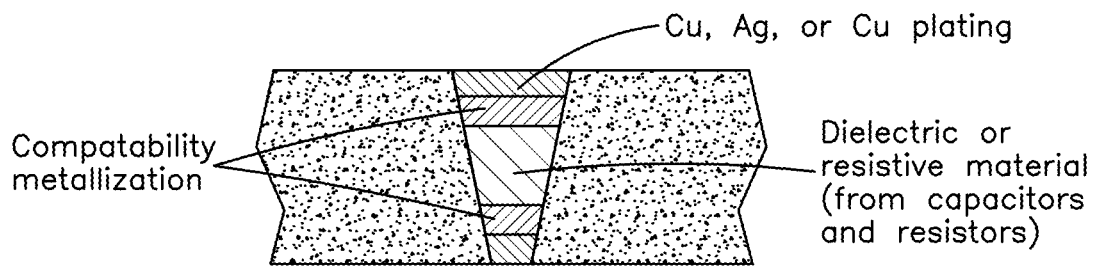
Figure 11D:
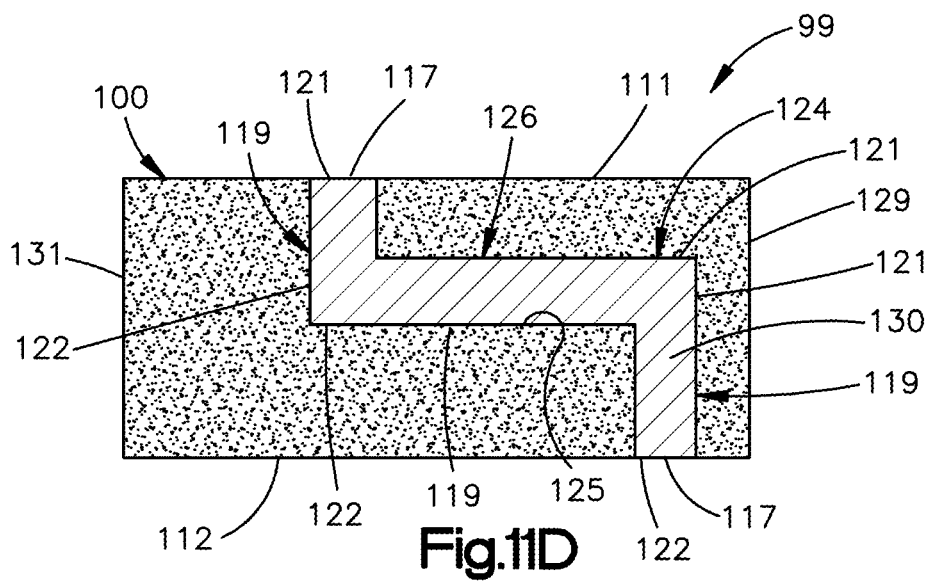
FIG. 11D is a schematic sectional side elevation view of a substrate having a recess constructed in accordance with an embodiment of the present disclosure.
Figure 11E:
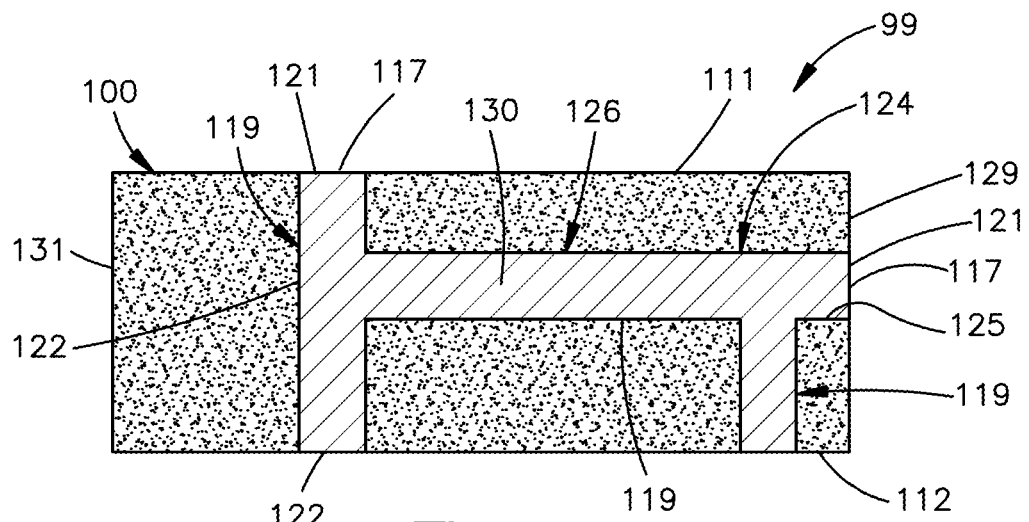
FIG. 11E is a schematic sectional side elevation view of a substrate having a recess constructed in accordance with an embodiment of the present disclosure.
Figure 11F:
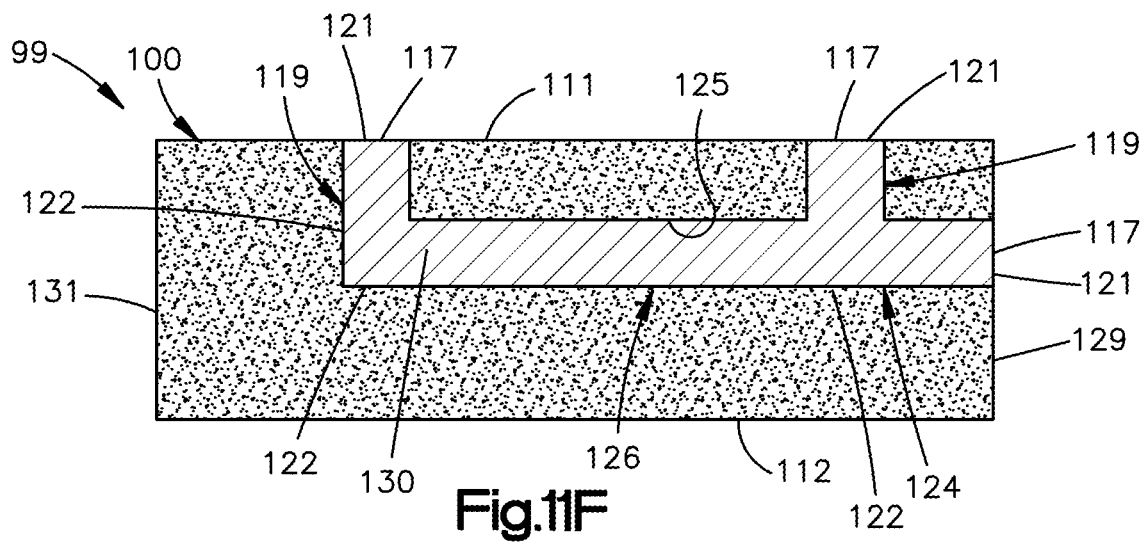
FIG. 11F is a schematic sectional side elevation view of a substrate having a recess constructed in accordance with an embodiment of the present disclosure.
Figure 11G:
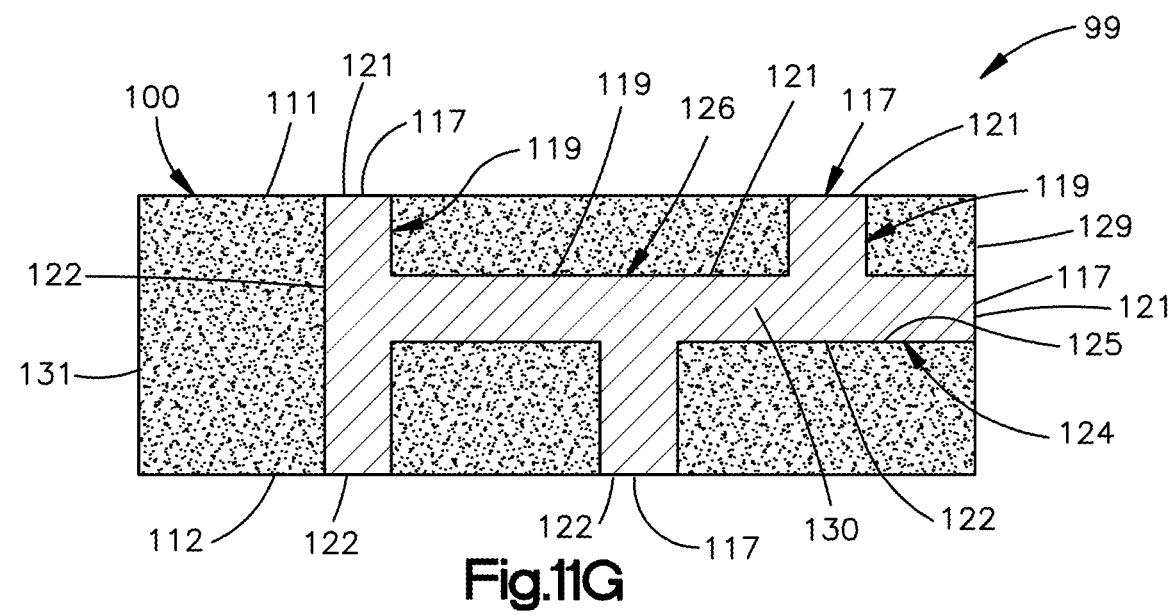
FIG. 11G is a schematic sectional side elevation view of a substrate having a recess constructed in accordance with an embodiment of the present disclosure.
Figure 11H:
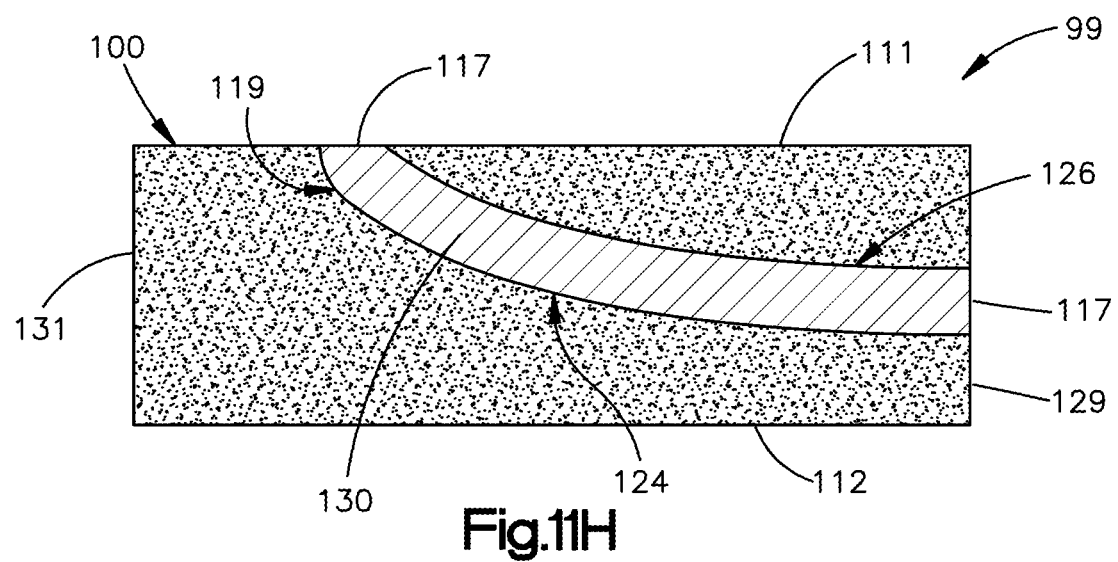
FIG. 11H is a schematic sectional side elevation view of a substrate having a recess constructed in accordance with an embodiment of the present disclosure.

As seen in FIGS. 1 and 2, the present disclosure features a conductive component 99 that includes a glass substrate 100 for use in electronic (such as semiconductor), optoelectronic, biosensor, or fluidic applications, said glass substrate 100 comprising an external first surface 111 and an external second surface 112 that is opposite the first surface 111 along a transverse direction. In one example, the first surface 111 can define an external top surface, and the second surface 112 can define an external bottom surface. Thus, the first surface 111 can be referred to as an external top surface. The second surface 112 can be referred to as an external bottom surface. The substrate 100 can further include at least one passage 119 that extends from a first end 121 to a second end 122. The first passage 119 can extend from at least one of the first and second surfaces 111 and 112 toward the other of the first and second surfaces. Thus an opening 117 to the at least one passage 119 can be defined in the at least one of the first and second surfaces 111 and 112. In one example, the passage 119 can be configured as a hole 120. In one example, the hole 120 can be configured as a through-hole that extends from the first surface 111 to the second surface 112. For instance, the through-hole can extend from a first opening 117 in the first surface 111 to a second opening 117 in the second surface 112. However, as described herein, the passages 119 can be configured in any suitable alternative manner as desired. The substrate 100 can define at least one internal side wall 125 that defines the passage 119.

In some embodiments, at least one interior layer 130 can be disposed inside the passage 119. Further, at least one electrically conductive external layer 140 can be configured as a redistribution layer that is disposed on one or more of the external surfaces of the substrate 100. The external layer 140 can be a metallized layer. For instance, at least one the external layer 140 can be disposed on first surface 111. Alternatively or additionally, at least one external layer 140 can be disposed on the second surface 112. In some embodiments, the interior layer 130 comprises at least one metallized layer. Thus, the passage 119 containing the interior layer 130 can be configured as an electrically conductive via. In some embodiments, the metallized layer comprises at least one metallized paste composition. In some embodiments, the passage 119 is substantially filled with at least one metallized paste composition. In some embodiments, at least one metallized layer substantially occupies the volume of the passage 119 after firing and curing the glass substrate 100. At least one of the external layers 140 can be in communication with at least one of the passages 119.

In one preferred embodiment, the glass substrate comprises a plurality of passages 119, wherein each passage 119 defines a first end, a second end opposite the first end, and is defined by at least one sidewall of the substrate that extends from the first end to the second end. The at least one sidewall of the substrate can be an external sidewall or an internal sidewall. At least one interior layer can be disposed inside each internal passage 119. The plurality of passages is each substantially filled with at least one metallized paste composition. At least one metallized layer substantially occupies the volume of each passage after firing and curing the glass substrate.

In some embodiments, a plurality of interior layers 130a, 130b. 130c is disposed inside the passage. The interior layers can be electrically conductive. In some embodiments, a plurality of external layers 140 is disposed on the first surface 111. In some embodiments, a plurality of external layers 140 is disposed on the second surface 112. In some embodiments, each interior layer 130 comprises at least one metallized layer. In some embodiments, each interior layer 130 comprises a plurality of metallized layers. In some embodiments, each metallized layer comprises at least one metallized paste composition. In some embodiments, each metallized layer comprises a plurality of metallized paste compositions. In some embodiments, each passage 119 can be substantially filled with at least one metallized paste composition. In some embodiments, each passage 119 can be substantially filled with a plurality of metallized paste compositions. In some embodiments, at least one metallized layer can substantially occupy a substantial entirety of the volume of each passage 119 after firing and curing the glass substrate 100. In some embodiments, a plurality of metallized layers occupies a substantial entirety of the volume of each passage 119 after firing and curing the glass substrate 100. In some examples, one or more of the external layers 140 can be in electrical communication with one or more of the passages 119. For instance, one or more of the external layers can physically contact at least one of the interior layers of one or more of the passages 119. Alternatively or additionally, one or more of the external layers 140 can be electrically isolated from one or more of the passages 119.

In some embodiments, the first surface 111, second surface 112, and the interior layer 130 are at a same level. In some embodiments, the interior layer 130 is polished to remove any protruding metallization. In some embodiments, the first surface 111 and second surface 112 are polished off to be at the same level as the interior layer 130.

In some embodiments, the passages 119 can be at least partially filled using thick film technology. In some embodiments, the passages can be at least partially filled by plating. In some embodiments, the passages 119 can be plated at the first end 121, the second end 122, or a combination thereof.

In some embodiments, an inner metallized layer differs in composition from an outer metallized layer. In some embodiments, the plating is metal. In some embodiments, the metal is copper, silver, gold, nickel, palladium, platinum, aluminum, oxides thereof, alloys thereof, and mixtures thereof, including one or more combinations thereof. In some embodiments, the passage 119 can contain a polymer conductive thick film. In some embodiments, the polymer conductive thick film is cured in a temperature between 40° C. and 515° C.

In some embodiments, the interior layer 130 comprises a copper thick film entirely, a silver thick film, and a copper thick film partially. In some embodiments, the interior layer 130 comprises a copper thick film and plated copper. In some embodiments, the interior layer 130 comprises plated copper, thick film copper, and plated copper. In some embodiments, the interior layer 130 comprises plated copper, thick film silver, and plated copper. In some embodiments, the interior layer comprises a copper layer, a silver layer, at least a portion of an electrical circuit or electronic component, another silver layer, and another copper layer. The electrical circuit can be a three-dimensional electrical circuit, meaning that it extends in more than one plane along its length.

In some embodiments, the electronic component is disposed in the interior layer 130. In some embodiments, the electronic component is a capacitor. In some embodiments, the electronic component is a resistor. In some embodiments, the electronic component can be an inductor. In some embodiments, the electrical component can be an attenuator. In some embodiments, an electronic component material comprises compounds or oxides of Ba, Bi, Ti, Sr, Ru, C, Ni, Fe, Pb, Al, Ca, Cu, Cr, Ag, Zn, Zr, V, or mixtures thereof. In some embodiments, when a conductor is a conductive polymer, the electronic component material is an organic polymer. In other embodiments, the electronic component material can be lead-free, meaning that the electronic component material can be free of lead including lead oxides, lead alloys, lead compounds, and all lead constituents. In some embodiments, the organic polymer comprises compounds or oxides of Ba, Bi, Ti, Sr, Si, Ru, Ti, C, Ni, Fe, Pb, Al, Ca, Cu, Cr, Ag, Zn, Zr, V, or mixtures thereof. In other embodiments, the organic polymer can be lead-free, meaning that the organic polymer can be free of lead including lead oxides, lead alloys, lead compounds, and all lead constituents.

In some embodiments, the sidewall 125 is coated. In some embodiments, the coating is copper, silver, gold, glass, silicon compounds, or a combination thereof. The side wall 125 can be coated directly. In other embodiments, the side wall 125 can be coated with an adhesion promoting layer, and then subsequently coated with at least one electrically conductive material such as copper, silver, gold, nickel, palladium, platinum, aluminum, oxides thereof, alloys thereof, and mixtures thereof, including one or more combinations thereof. For instance, the at least one electrically conductive material can be electroplated to the adhesion promoting layer. Thus, the adhesion promoting layer can be disposed between the side wall 125 and the at least one conductive material.

Referring now to FIGS. 11A-11H, and as described above, the substrate defines at least one passage 119 that can contain at least one electrically conductive interior layer 130. At least one first one of the passages 119 can be in communication with at least one second one of the passages 119 so as to define a conduit 124 that includes a plurality of passages 119. The conduit 124 can be open to at least one external surface of the substrate 120 in order to allow for the introduction of the paste into the conduit 124.

In one example, one or more of the passages can define a hole 120 that extends along a first direction between the first and second external surfaces 111 and 112 of the substrate 100. The first and second surfaces 111 and 112 can be top and bottom surfaces of the substrate 100 in one example, though the first and second surfaces 111 and 112 are not intended to be so limited, and can depend on the orientation of the substrate 100. In one example, when at least one of the passages 119 is configured as a hole 120, the first and second ends 121 and 122 of the passage 119 can be aligned with each other along the first direction. In one example, the substrate 120 can define a thickness from the first surface 111 to the second surface 112. The thickness along the first direction can be less than at least one other external dimension of the substrate 120 along a direction perpendicular to the first direction. For instance, the thickness along the first direction can be less than all other external dimension of the substrate 100 along a plane that is oriented perpendicular to the first direction. In some examples, the hole 120 can be elongate along the first direction. Thus, in some examples, one or more of the passages 119 can be elongate along the first direction.

In one example, one or more of the holes 120, and thus one or more of the passages 119, can be configured as a through-hole as described above with respect to FIGS. 1-2. Thus, the through-hole can extend from the first surface 111 to the second surface 112. For instance, when at least one of the passages 119 is configured as a through-hole, the first end 121 of the passage 119 is defined by a first opening 117 at the first external surface 111 and a second opening 117 at the second external surface 112. Thus, the through-hole can be said to be open to each of the first surface 111 and the second surface 112 along the first direction. It should be appreciated that it can be said that the through-hole extends along the first direction between the first and second surfaces 111 and 112. The opening 117 can be referred to as an opening to at least one of the passages 119. Further, the opening 117 can be referred to as an opening to the corresponding conduit 124.

Alternatively or additionally, one or more of the holes 120, and thus one or more of the passages 119, can be configured as a blind hole. The blind hole can extend from one of the first and second surfaces 111 and 112 toward the other one of the first and second surfaces 111 and 112. Further, the blind hole can terminate at a location spaced from the other of the first and second surfaces and 112. Thus, in one example, when at least one of the passages 119 is configured as a blind hole, the first end 121 of the passage 119 can be defined by an opening 117 in the first surface 111. The second end 122 of the passage 119 can be spaced from the second surface 112 along the first direction. Alternatively, when at least one of the passages 119 is configured as a blind hole, the second end 122 of the passage 119 can be defined by an opening 117 in the second surface 112, and the first end 121 of the passage 119 can be spaced from the first surface 111 along the first direction. Thus, it can be said that the blind hole is open to one of the first and second surfaces 111 and 112 along the first direction, and closed with respect to the other of the first and second surfaces 111 and 112 along the first direction. It should be appreciated that it can be said that the blind hole extends along the first direction between the first and second surfaces 111 and 112.

Alternatively or additionally still, one or more of the holes 120, and thus one or more of the passages 119, can be configured as a buried hole. The buried hole can extend from a first location spaced from the first surface 111 to a second location that is spaced from the second surface 112 along the first direction. The first and second locations can be spaced from each other along the first direction. For instance, the first and second locations can be aligned with each other along the first direction. Thus, in one example, when at least one of the passages 119 is configured as a buried hole, the first end 121 of the passage 119 terminate at a location between the second end 122 and the first surface 111 of the substrate 100 with respect to the first direction. Further, the second end 122 of the passage 119 terminate at a location between the first end 121 and the second surface 112 with respect to the first direction. Thus, it can be said that the buried hole is closed to each of the first and second surfaces 111 and 112 of the substrate 100. It should be appreciated that it can be said that the buried hole extends along the first direction between the first and second surfaces 111 and 112.

As described above, at least one or more of the passages 119 can be configured as a hole 120. Alternatively or additionally, one or more of the passageways 119 can be configured as a channel 126. The substrate 100 can define a first external side 129 and a second external side 131 that are opposite with respect to each other along a second direction. The first and second external sides 129 and 131 can extend from the first surface 111 to the second surface 112. The first and second external sides 129 and 131 can define respective external first and second side surfaces, respectively. The second direction can extend along a plane that is oriented perpendicular to the first direction. In one example, the first and second external sides 129 and 131 can be opposite each other. The channel 126 can extend along the second direction between the first and second sides 129 and 131. Thus, the channel 126 can extend along the plane. In one example, the second direction can define a second distance that is greater than the thickness of the substrate. For instance, the second distance can define a length, width, or diameter of the substrate 100. The first and second sides 129 and 131 can be spaced from each other along a horizontal direction in one example, though the first and second sides 129 and 131 are not intended to be so limited, and can depend on the orientation of the substrate 100. In one example, when at least one of the passages 119 is configured as a channel 126, the first and second ends 121 and 122 of the passage 119 can be aligned with each other along the second direction. Further, the first and second ends 129 and 122 of the passage 119 configured as a channel 126 can be opposite each other along a respective direction of elongation.

One or more up to all of the channels 126 can intersect one or more of the holes 120. For instance, one or more of the channels 126 can terminate at one or more of the holes 120. Alternatively or additionally, one or more of the channels 126 can traverse and cross one or more of the holes 120. Further, one or more of the holes 120 can terminate at one or more of the channels 126. Alternatively or additionally, one or more of the holes 120 can traverse and cross one or more of the channels 126. Further, some or all of the channels 126 can be spaced in their respective entireties from all of the holes 120. It should further be appreciated that respective some or all of the channels 126 can be oriented parallel to each other along the plane. Alternatively or additionally some or all of the channels 126 can be oriented at a non-zero angle with respect to each other. Further, among those channels 126 that are oriented at a non-zero angle with respect to each other, some or all of the channels 126 can intersect each other. Alternatively or additionally, among those channels 126 that are oriented at a non-zero angle with respect to each other, some or all of the channels 126 can be spaced from each other along their respective entireties.

In one example, one or more of the holes 120, and thus one or more of the passages 119, can be configured as a through-channels. The through-channel can extend from the first side 129 to the second surface side 131. For instance, when at least one of the passages 119 is configured as a through-channel, the first end 121 of the passage 119 is defined by a first opening 117 at the first side 129 and second opening 117 at the second side 131. Thus, the through-channel can be said to be open to each of the first side 129 and the second side 131 along the second direction. It should be appreciated that it can be said that the through-channel extends along the second direction between the first and second sides 129 and 131.

Alternatively or additionally, one or more of the channels 126, and thus one or more of the passages 119, can be configured as a blind channel. The blind channel can extend from one of the first and second sides 129 and 131 toward the other one of the first and second sides 129 and 131. Further, the blind channel can terminate at a location spaced from the other of the first and second sides 129 and 131. Thus, in one example, when at least one of the passages 119 is configured as a blind channel, the first end 121 of the passage 119 can be defined by an opening 117 in the first side 129. The second end 122 of the passage 119 can be spaced from the second side 131 along the second direction. Alternatively, when at least one of the passages 119 is configured as a blind channel, the second end 122 of the passage 119 can be defined by an opening 117 in the second side 131, and the first end 121 of the passage 119 can be spaced from the first side 129 along the first direction. Thus, it can be said that the blind channel is open to one of the first and second sides 129 and 131 along the second direction, and closed with respect to the other of the first and second sides 129 and 131 along the second direction. It should be appreciated that it can be said that the blind channel extends along the second direction between the first and second sides 129 and 131.

Alternatively or additionally still, one or more of the channels 126, and thus one or more of the passages 119, can be configured as a channel. The buried channel can extend from a first location spaced from the first side 129 to a second location that is spaced from the second side along the second direction. The first and second locations can be spaced from each other along the plane. For instance, the first and second locations can be aligned with each other along the plane. Thus, in one example, when at least one of the passages 119 is configured as a buried channel, the first end 121 of the passage 119 terminates at a location between the second end 122 and the first side 129 of the substrate 100 with respect to the direction of elongation, and thus also with respect to the second direction. Further, the second end 122 of the passage 119 terminates at a location between the first end 121 and the second side 131 with respect to the direction of elongation, and thus also with respect to the second direction. Thus, it can be said that the buried hole is closed to each of the first and second sides 129 and 131 of the substrate 100. It should be appreciated that it can be said that the buried channel extends along the second direction between the first and second sides 129 and 131.

In one example, at least one or more of the channels 126 can be configured as internal channels whereby respective entireties of the channels 126 are spaced from each of the first and second external surfaces 111 and 112 of the substrate 100. Thus, no portion of the internal channel is open to either of the first and second surfaces 111 and 112 of the substrate 100. Alternatively or additionally, at least one or more of the channels 126 can be configured as a recess 128 that extends into a select external surface of the substrate 100 that can be defined by one of the first and second outermost external surfaces 111 and 112 or one of the external sides 129 and 131 of the substrate 100. Thus, external surfaces of the substrate 100 can define an external recessed surface 113 in the recess 118 that is recessed with respect to a remainder of the respective external surface of the substrate 100.

At least one or more of the recesses 128 can extend into a select one of the outermost external surfaces 111 and 112, and the recess 128 can terminate at a location between the first and second external surfaces 111 and 112 with respect to the first direction. Thus, the recessed surface 113 can be recessed with respect to a remainder of the select one of the outermost external surfaces 111 and 112. In one example, the recess 128 can extend into the first external surface 111. In another example, the recess 128 can extend into the second external surface 112. Further, the recess 128 that extends into one of the first and second external surfaces 111 and 112 can be elongate along the second direction.

Alternatively or additionally, at least one or more of the recesses 128 can extend into a select one of the external sides 129 and 131, and the recess 128 can terminate at a location between the first and second sides 129 and 131 with respect to the second direction. Thus, the recessed surface 113 can be recessed with respect to a remainder of the select one of the external sides 129 and 131. In one example, the recess 128 can extend into the first side 129. In another example, the recess 128 can extend into the second side 131. Further, the recess 128 that extends into the select one of the first and second sides 129 and 131 can be elongate along the first direction. Alternatively, the recess 128 that extends into the select one of the first and second sides 129 and 131 can be elongate along any direction that extends through the first and second surfaces 111 and 112.

At least one or more of the recesses 128 can intersect at least one of the holes 120, thereby placing the recess in electrical communication with the one of the holes 120. Alternatively or additionally, at least one or more of the recesses 128 can intersect at least one of the internal channels 126, thereby placing the recess in electrical communication with the one of the holes 120. Thus, one or more of the conduits 124 can include the recess 128. Further, at least one of the recesses 128 can intersect one or more other ones of the recesses 128 so as to form at least a portion of the respective conduit 124. Alternatively or additionally, one or more of the recesses 128 can be electrically isolated from all others of the recesses 128. The recess 128 can be in electrical communication with all passages 119 of the conduit 124.

Each of the conduits 124 can include at least one hole 120. Alternatively or additionally, each of the conduits 124 can include at least one channel 126. Alternatively or additionally, each of the conduits 124 can include at least one recess 128. Thus, it can be said that each of the conduits 124 can include at least one of 1) at least one of the holes 120, 2) at least one of the channels 126, and 3) at least one of the recesses 128. The conduits 124 can define any geometry as desired. For instance, the conduits can define jogged regions that extend along the first direction. Alternatively or additionally, the conduits can define jogged regions that extend along the second direction.

With continuing reference to FIGS. 11A-11H generally, at least one of the passages 119 can be configured as an oblique passage that extends along a direction that defines an oblique angle to one or both of the first direction and the second directions. In one example, at least one of the oblique passages can extend between a select one of the first and second external surfaces 111 and 112 toward a select one of the first and second side surfaces 129 and 131. One or more of the oblique passages can be configured as a through-passage that extends from one external surface of the substrate 100 to another external surface of the substrate 100. Alternatively or additionally, one or more of the oblique passages can be configured as a blind passage that extends from one of the external surfaces of the substrate 100 toward another of the external surfaces of the substrate 100, and terminates without extending to the another of the external surfaces of the substrate 100. Alternatively or additionally still, the oblique passage can be configured as a buried oblique passage whose first and second ends 121 and 122 are closed. In one example, at least one of the oblique passages can be linear along a portion up to an entirety of its length. Alternatively or additionally, at least one of the oblique passages can be curved along a portion up to an entirety of its length. Thus, at least a portion of the conduit 124 can extend along a curved path.

It should be appreciated that the at least one passages 119 can be in fluid communication with one or more others of the passages 119 prior to metallization so as to define a conduit 124. After conduit 124 has been metalized, the conduit 124 can be referred to as an electrically conductive via.

At least one of the conduits 124 can include a plurality of openings 117 that are in fluid communication with each other. The openings 117 can include openings that are defined by the select external surface of the substrate 100. Alternatively or additionally, the openings 117 can include openings that are defined by different select external surfaces of the substrate 100. In one example, at least one of the conduits 124 can define openings 117 that are defined by the same external surface of the substrate 100. The same external surface can be defined by one of the first and second surfaces 111 and 112. Alternatively or additionally, the same external surfaces can be defined by one of the first and second sides 129 and 131.

One or more up to all of the openings 117 at the first and second outer surfaces 111 and 112 can be defined by outermost surfaces of the substrate 100. Alternatively or additionally, one or more of the openings 117 can be defined at the recessed surface 113 of the recesses 128.

In one aspect of the present disclosure, the recesses 128 can be filled with a first interior layer that is defined by a first electrically conductive material. The passages 119 can be filed with at least one second interior layer that is defined by a second electrically conductive material. The substrate 100 can include a third electrically conductive material that is 1) positioned on an external surface of the substrate 110 adjacent the recess 128, and 2) electrically connected to the first electrically conductive material. In this aspect of the present disclosure, the external surface can be referred to as a first external surface, and the recess can be referred to as a first recess. A second recess can be defined by a second surface of the substrate that is opposite the first surface, the second recess filled with a fourth electrically conductive material. A fifth electrically conductive material can be positioned on the second surface of the substrate and electrically connected to the fourth electrically conductive material. The third electrically conductive material and the fifth electrically conductive material can be the same material. The first electrically conductive material and the fourth electrically conductive material can be the same material.

It should be appreciated that the substrate 100 can include a plurality of conduits 124 that are isolated from each other with respect to fluid communication. Thus, when the conduits 124 that are isolated from each other are metallized, the conduits 124 are electrically isolated from each other. Accordingly, an electrically conductive material that is introduced into one of the conduits 124 does not travel from the one of the conduits 124 to another of the isolated conduits 124 within the substrate 100. Alternatively or additionally, two or more portions of a conduit 124 can share a common recess 128 in an external surface of the substrate 100.

As described above, a conductive component 99 can include the substrate 110 and the at least one conductive material that is disposed in each of the passages 119. The at least one conductive material can be at least one or both of thermally conductive and electrically conductive. Thus, the conductive component 99 can be at least one or both of a thermally conductive component and an electrically conductive component. The conductive material can define the interior layer 130 described above. In one example, at least one the conductive material can be configured as at least one paste. Thus, the conductive component 99 can include first and second conductive materials configured as first and second different pastes of the type described above Further, the at least one conductive material can extend along a substantial entirety of the passage 119. In one example, the at least one conductive material can extend continuously through each of the conduits 124. In particular, the at least one conductive material can extend continuously in the conduit 124 from each of the openings 117 of the conduit 124 to each of the openings 117 of the conduit 124. As will be appreciated below, a system can be created as a combination of a plurality (e.g., at least two) conductive components 99 or substrates joined to each other.

The at least one conductive material can include the first and second conductive materials, which can be electrically conductive materials. The first and second conductive materials can be chemically different than each other. The first and second conductive materials can be configured as pastes in one example. The first conductive material can be disposed in a middle portion of the conduit 124. The second conductive material can be disposed in an outer portion of the conduit 124. Thus, the second conductive material can extend from the first conductive material to an external surface of the substrate 100. For instance, the second conductive material can extend in one or more at least one passage 119 from the first conductive material to the one or more openings 117 from which the one or more of the at least one passage 119 extends. Thus, the second conductive material can extend from the first surface 111 to the first conductive material in the passage 119. Alternatively or additionally, the second conductive material can extend from the second surface 112 to the first conductive material in the passage 119. Alternatively or additionally still, the second conductive material can extend from the first conductive material to the first side 129. Alternatively or additionally still, the second conductive material can extend from the first conductive material to the second side 131.

Thus, the first conductive material can extend along a first length of the passage 119, and the second conductive material can extend along a second length of the passage 119. The second length can be less than the first length. For instance, the first conductive material can occupy about 75% to about 95% of a total length of the at least one passage 119. The second conductive material can occupy about 5% to about 25% of the total length of the passage 119. As described above, the second conductive material can further metalize at least one outer surface of the substrate so as to electrically connect the at least one outer surface of the substrate with the passage 119. Further, the first conductive material can extend along a first length of the conduit 124, and the second conductive material can extend along a second length of the conduit 124. In particular, the second conductive material can extend from the first conductive material to a select one or more external surfaces of the substrate 100.

As described above, the at least one conductive material can be introduced into one or more up to all of the passages 119 using thick film technology. The at least one conductive material can be sintered in passages 119, thereby bonding the at least one conductive material to the at least one side wall 125 that defines the at least one passage 119. Thus, the at least one conductive material can fill the passages 119 such that the at least one conductive material establishes an electrically conductive path from one of the openings 117 to another one of the openings 117. For instance, the at least one conductive material establishes an electrically conductive path from and to all of the openings 117 of a respective one of the conduits 124.

Paste can be applied to an external surface of the substrate 100 and through one or more passages 119 of the substrate 100. For instance, the paste can be applied to the substrate 100 in the passages 119 by a screen printing operation, and/or vacuum, and/or isostatic pressure. This operation can be repeated as many times as desired with a sintering operation in between the operations.

As described above the paste can include 1) a powder of electrically conductive particles having a particle size ranging from about 10 nanometers to about 24 microns, wherein the particles comprise at least one of copper, gold, silver, palladium, platinum, nickel, aluminum, tungsten, molybdenum, oxides thereof, alloys thereof, and mixtures thereof, 2) the lead-free glass frit composition containing a zinc oxide, the solvent that carries the glass frit and the powder, and an ethyl cellulose resin mixed with the solvent. The metallized paste can have a coefficient of thermal expansion within 25% of that of a borosilicate substrate 100. The sintering can be performed in a nitrogen environment.

As described above, the passages 119 can be defined by the ISLE process or by ablation. Thus, the passages 119 can be defined by the substrate 100 that is a single homogenous monolithic substrate. The single homogenous monolithic substrate 100 can define the conduit 124 including one or more passages 119. It should thus be appreciated that the substrate 100 can be a non-laminated substrate, and the at least one conductive material can define an electrical trace that is not stitched into the non-laminated substrate 100, and the non-laminated substrate 100 is not overmolded around the electrically conductive trace that is defined by the at least one conductive material. Further, the electrical component can be configured such that the electrically conductive trace does not extend along or penetrate an outermost surface of the substrate 100. It is appreciated that the trace can be defined by a liquid electrically conductive paste that is hardened, such that the trace that forms a geodesic line around the glass substrate 100. In one example, one or more of the conduits 124 can define a capacitor.

A method of fabricating a conductive component 99 can include the first step of irradiating a first region of a glass substrate from substantially one of the first and second surfaces 111 and 112 toward the other of the first and second surfaces 111 and 112 to an end of the first region. The method can further include the first step of etching the irradiated first region such that glass is removed from the first region, thereby creating the conduit 124 having the at least one first channel 119. Alternatively or additionally, the method can include a first step of ablating the first region of the glass substrate so as to create the conduit 124 having at least one passage 119. The method can further include the step of metallizing the at least one first passage 119 as described herein.

The method can further include the second step of irradiating a second region that extends from the first region along a second direction that is angled with respect to the first direction. The first and second steps of irradiating can define the first and second regions in a single irradiating step. Alternatively or additionally, the method can include the second step of ablating the second region. The first and second steps of ablating can define the first and second regions in a single ablating step. The method can further include the second step of etching the irradiated second region so as to remove the glass from the second region, such that the conduit 124 further includes a second passage that extends from the first passage.

The first and second etching steps can be performed simultaneously such that the at least one first passage 119 and the at least one second passage 119 are formed simultaneously. Similarly, the first and second ablating steps can be performed simultaneously such that the at least one first passage 119 and the at least one second passage 119 are formed simultaneously. The metallizing step can further include metallizing at least one hole 120 and at least one channel 126 of a respective one of the conduits 124. The at least one hole 120 and the at least one channel 126 can be metallized substantially simultaneously. The metallizing step can include the step of applying the adhesion promoter 127 to the inner side wall 125 of the substrate in each of the passages 119, including the at least one hole 120 and the at least one channel 126, and electroplating the at least one conductive material to the adhesion promoter 127. Alternatively, the metallizing step can include the step of sintering the at least one conductive material while the conductive material is disposed in each of the at least one hole 120 and the at least one channel 126.

Alternatively still, the metallizing step can include the step of increasing a quantity of the solvent so as to decrease the viscosity of the at least one conducive material, and causing the at least one conductive material to flow through the conduit 124 so as to coat the side wall 125. This can coat the side wall 125 with the at least one conductive material so as to define an opening that extends through the at least one conductive material along the length of the conduit 124. Multiple steps of causing the at least one conductive material to flow through the conduit 124 so as to coat the side wall 125 can iteratively fill the conduit 124 with the conductive material.

The metallizing step can cause the at least one conductive material to extend continuously along an entirety of the conduit 124 so that all openings 117 to the conduit 124 are in electrical communication with each other.

The metallizing step can include the step of metallizing, with at least one lead-free conductive material, at least one passage 119 of the substrate 100 up to all of the passages 119 of the substrate 100. The metallizing step can include the steps of metallizing a first length of at least one conduit 124, with a first lead-free electrically conductive material that extends along a first length of the conduit 124, and metallizing a second length of the at least one conduit 124 with a second lead-free electrically conductive material, wherein the second length extends from the first lead-free electrically conductive material one or more up to all of the openings 117 of the conduit 124. The second lead-free electrically conductive material is different than the first lead-free electrically conductive material. The method can further include the step of curing the paste in the at least one conduit 124. The metallizing step can further include the step of creating an opening that extends through the at least one lead-free electrically conductive material along the length of at least a portion up to an entirety of the at least one conduit 124. Alternatively or additionally, the metallizing step can include the step of filling the at least a portion up to an entirety of the at least one conduit 124 with the at least one lead-free electrically conductive material.

The first irradiating step can cause the first region to terminate at a location between the first and second surfaces 111 and 112, such that the etching step creates one or more of at least one blind hole, at least one through-hole, and at least one buried hole. The metallizing step can include the step of metallizing the one or more of at least one blind hole, at least one through-hole, and at least one buried hole.

The first irradiating step and the first etching step can include the step of causing at least a portion up to an entirety of the passageway 119 to extend along a curved path and/or an oblique path. Alternatively or additionally, the first irradiating step and the first etching step can include the step of causing at least a portion up to an entirety of the first channel 119 to extend along a straight path. Similarly, a second irradiating step and a second etching step can include the step of creating a channel 126, which can include at least one or more of at least one through-channel, at least one blind channel, and at least one buried channel. The second irradiating step can be performed after or before the first irradiating step, or simultaneously with the first irradiating step. Further, the second etching step can be performed after or before the first etching step, or simultaneously with the first etching step.

Thus, at least one irradiating step and at least one etching step can include the step of creating a plurality of the passages 119 in the substrate 100. Certain of the passages 119 can be in fluid communication with each other, including one or more of holes 120 and channels 126. The irradiating steps and the etching steps include the step of creating at least one opening 117 to the conduit 124 in an exterior surface of the substrate 100. The chemical etching can be enhanced by subjecting the substrate 100 to megasonic and/or-ultrasonic vibration.

The method can further include the step of irradiating and etching the substrate 100 so as to create a plurality of conduits 124 in the manner described above. The conduits 124 can be isolated from each other with respect to fluid flow therebetween within the substrate 100. Each of the plurality of conduits 124 can then be metallized in the manner described above. A method can further be provided for attaching first and second substrates 100 to each other after performing the irradiating steps, the etching steps, and the metalizing step on each of the first and second substrates. Alternatively, first and second substrates 100 can be attached to each other after performing the irradiating steps and the etching steps. The metallizing step can be performed in the conduits after the first and second substrates have been attached to each other. Alternatively still, a single homogeneous monolithic substrate 100 can be irradiated and etched so as to create any one or more up to all of the passages 119, including one or more of at least one through hole, at least one blind hole, at least one buried hole, at least one through channel, at least one blind channel, at least one buried channel, at least one recess, and at least one oblique passage.

Referring now to FIGS. 12A-12D, it is recognized that a system 150 can define a conductive component that can include at least first and second ones of the conductive components 99 joined to each other. For instance, external surfaces of first and second ones of the substrates 100 can be joined to each other. For instance, the second surface 112 of a first one of the substrates 100 can be joined to the first surface 111 of a second one of the substrates 100. The substrates 100 can be attached to each other such that a portion of at least one or more of a plurality of respective passages 129 of the substrates 100 are aligned with each other, and are in electrical communication with each other. For instance, a portion of at least one or more of a plurality of respective passages 129 of the substrates 100 can contact each other. For instance, recesses 128 of the first and second substrates 100 can be aligned with each other. Alternatively or additionally, openings 117 of the first and second substrates 100 can be aligned with each other. The system can include any number of combined substrates 100 as desired. The combined substrates can be stacked in one example. It is recognized that the individual substrates 100 can include one or more passages 119 of the type described above. The individual substrates 100, when combined, can thus also define one or more passages 119 of the type described above. For instance, one or more of the passages 119 of the combined substrates can be defined by a combination of passages 119 of the individual substrates 100. Alternatively or additionally, one or more of the substrates 100 of the system 150 can be configured as a spacer 101 that spaces at least two of the substrates 100 from each other so as to define an internal cavity 152. While the system 150 can include multiple substrates that define at least some of the passages as described above, it should be appreciated that the system can alternatively include a single monolithic substrate 100 that defines the passages that can be fabricated in any manner described herein.

After the substrates 100 are joined, the passages 119 can be metalized in the manner described above. Alternatively, the monolithic substrate 100 can be metalized in the manner described above after the passages 119 have been created. Alternatively, the 119 of each of the substrates 100 can be metalized prior to the joining step. It is appreciated that the substrates 100 become conductive components upon metallization of the passages 119. Regardless of whether the passages 119 are metalized before or after the joining step, it can be said that the system 150 includes a plurality of conductive components 99 joined to each other. Further, at least one electrically conductive external layer 140 can be configured as a redistribution layer that is disposed on one or more of the external surfaces of at least one of the substrates 100, or the monolithic substrate. At least one of the external layers 140 can be in communication with at least one of the passages 119. In this regard, the conduit 124 can include at least one of the external layers 140 in combination with at least one of the passages in the manner described herein.

In one example, a plurality of substrates 100 can be joined to each other so as to define an internal cavity 152. For instance, the substrates 100 can be joined to each other such that the cavity 152 is hermetically sealed. The system 150 can include a plurality of substrates 100 that define respective portions of the internal cavity 152. For instance, first and second outer substrates 100 can define the first ends of the cavity 152 separated along the first direction, and a third middle substrate can be configured as a spacer that defines the perimeter of the cavity 152 with respect to a respective plane that is oriented normal to the first direction. In another example, the first and second outer substrates 100 can define the first ends of the cavity 152 separated along the second direction, and a third middle substrate can be configured as a spacer that defines the perimeter of the cavity 152 with respect to the first direction. In still another example, the first and second outer substrates 100 can define the first ends of the cavity 152 separated along a direction that is oblique to each of the first and second directions, and the third middle substrate can be configured as a spacer that defines the perimeter of the cavity 152 with respect to a plane normal to the oblique direction.

The conductive components 99 can be joined by organic polymer glass melting or welding, laser stitching which can take place at room temperature (also known as weld seaming or weld stitching), or any suitable alternative method of joining. Thus, in one example, the substrates 100 can be joined at respective interfaces by one or more weld seams 154 can that extend continuously about an entire perimeter of the cavity 152 so as to circumscribe the cavity, thereby hermetically sealing the cavity 152. For instance, the system 99 can include a plurality of weld seams 154 that are spaced from each other. One or more conduits or channels thereof can be disposed between the weld seams 154.

It is appreciated that different materials of the 99 system can be cured and/or fired at different temperatures. For instance, one set of channels can be fired at a first temperature. The substrates 100 can be joined together by firing the substrates at a second temperature different than the first temperature. For example, the second temperature can be less than the first temperature so that the previously fired channels are unaffected by the second firing operation.

In some embodiments, at least a portion of at least one or more up to all of the passages 119, and thus also the conduits 124, can be hermetic. In some embodiments, the at least a portion of the conduits 124 up to an entirety of the conduits 124 has a high conductivity. Otherwise stated, the metalized conduits 124 have a low resistivity. For instance, the resistivity can be less than 25 milli-ohm/square. In some embodiments, the resistivity is less than 20 milli-ohm/square. In some embodiments, the resistivity is less than 15 milli-ohm/square. In some embodiments, the resistivity is less than 10 milli-ohm/square. In some embodiments, the resistivity is less than 5 milli-ohm/square. In some embodiments, the resistivity is less than 3 milli-ohm/square. In some embodiments, the resistivity is less than 2 milli-ohm/square. In some embodiments, the resistivity is less than 1 milli-ohm/square.

In some embodiments, the substrates 100 described herein can eliminate flex cables for displays. In some embodiments, the substrate of the present disclosure can be used for transparent screen displays, CMOS sensors, optical signals, and the like. In some embodiments, the glass substrate of the present disclosure can be used for in biomedical applications such as lab on a chip or DNA sequencing slides or other glass slides used for applying bio materials for testing.

In some embodiments, the passages 119 can be polished prior to or after filling the hole. In some embodiments, the hole is polished from one or both sides of the glass surface to produce a more uniform hole. In some embodiments, the hole may be cylindrical, conical, and constant or varying in cross-section throughout the hole.

In some embodiments, a separate metallization structure cam be attached and/or stacked to the metallized glass substrate from one or both sides. In some embodiments, the separate metallization structure could be another glass based structure, a high temperature co-fired ceramic (HTCC) or low temperature co-fired ceramic (LTCC), a silicon or other semi-conductor structures, a flex circuit or a printed wiring board. In some embodiments, the thickness of the attached and/or stacked structure could have openings to accommodate devices attached to other glass substrates or stacked layers.

Figure 13A:
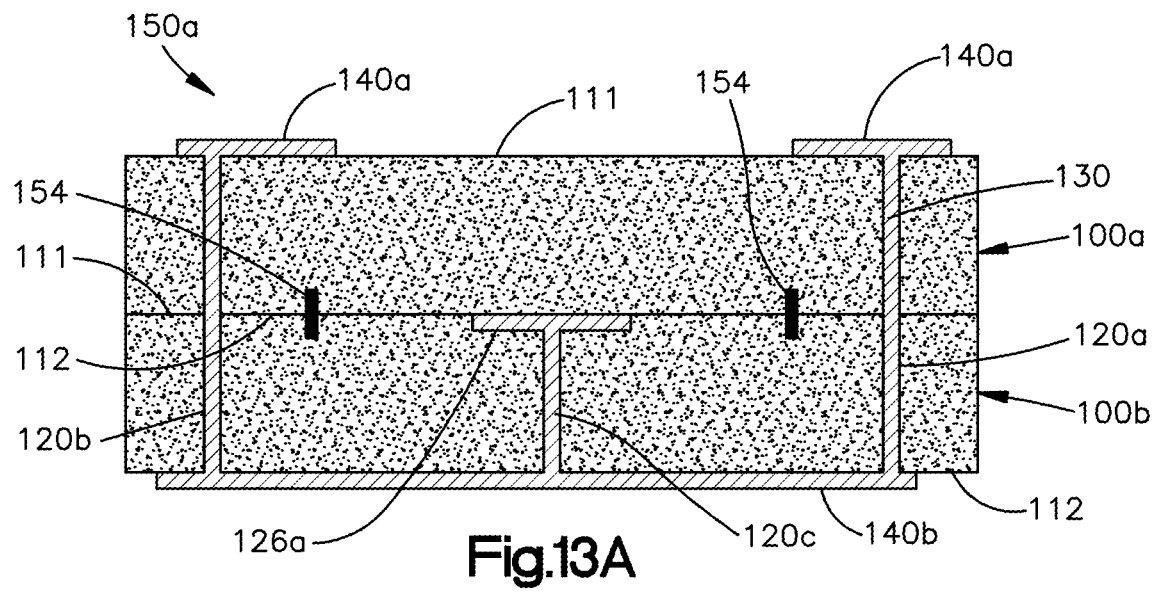
FIG. 13A is a schematic sectional side elevation view of a conductive component in accordance with one example.

Referring now to FIG. 13A, a system 150a of the type described above with respect to FIGS. 12A-12D is illustrated in accordance with one example. The system 150a can include a conductive component that has a first surface 111 and a second surface 112 opposite the first surface along the first direction.

The system 150a can include first and second through-holes 120a and 120b that extend from the first surface 111 of the system 150a to the second surface 112 of the system 150a along the first direction. The first and second through holes 120a and 120b can be spaced from each other along the second direction. The system 150a can further include a blind hole 120c that extends from the second surfaces 112 of the system 150a toward the first surface 111 of the system 150a. The blind hole 120c terminates at a location between the first and second surfaces 111 and 112 of the system 150a with respect to the first direction. The blind hole 120c can be disposed between the first and second through-holes 120a and 120b with respect to the second direction. The system 150 can further include a buried channel 126a that intersects the blind hole 120c. In particular, the blind hole 120c can terminate at the buried channel 126a. The first and second through-holes 120a and 120b, the blind hole 12c, and the buried channel 126a can all be metalized in the manner described herein.

The system 150a can include at least one first redistribution layer 140a that extends along the first surface 111 of the system 150a. The at least one first redistribution layer 140a can intersect each of the first and second through-holes 120a and 120b. The at least one first redistribution layer 140a can be referred to as at least one first top redistribution layer for the purposes of convenience, it being appreciated that the orientation of the system 150a can vary during use. In one example, the at least one first distribution layer 140a can include a pair of first and second top redistribution layers 140a and 140b that intersect respective ones of the first and second through holes 120a and 120b, respectively. The first and second top redistribution layers 140a and 140b can be spaced from each other along the first surface 111. For instance, the first and second top redistribution layers 140a and 140b can be spaced from each other along the second direction. In particular, each of the first and second through holes 120a and 120b can terminate at the at least one first redistribution layer 140a. For instance, the first and second through holes 120a and 120b can terminate at respective ones of the first and second top redistribution layers 140a. The system 150a can include a second redistribution layer 140b that extends along the second surface 112 of the system 150a. The second redistribution layer 140a can be referred to as a bottom redistribution layer for the purposes of convenience, it being appreciated that the orientation of the system 150a can vary during use. The second redistribution layer 140b can intersect each of the first and second through-holes 120a and 120b and the blind hole 120c. In particular, each of the first and second through holes 120a and 120b can the blind hole 120c can terminate at the second redistribution layer 140c. Thus, the through holes 120a and 120b, the blind hole 120c, the buried channel 126, and redistribution layers 140a and 140b are all in electrical communication with each other. Otherwise stated, the system 150a can include a conduit 124a that includes the through holes 120a and 120b, the blind hole 120c, the buried channel 126, and the redistribution layers 140a and 140b.

Figure 13B:
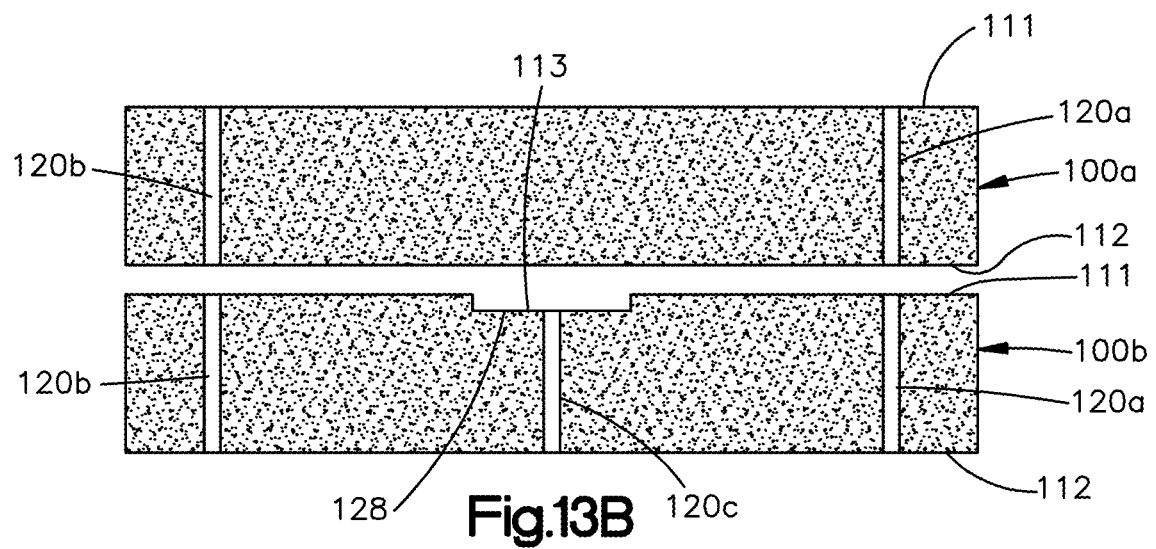
FIG. 13B is a schematic sectional side elevation view of first and second substrates of the conductive component illustrated in FIG. 13A.

Referring now to FIGS. 13B-13E, the system 150 can be defined by first and second substrates 100a and 100b. In particular, the first surface 111 of the system 150a can be defined by the first surface 111 of the first substrate 100a, and the second surface 112 of the system 150a can be defined by the second surface 112 of the second substrate 100b. In particular, as illustrated at FIG. 13B, the first and second substrates 100a and 100b can define respective through-holes 120a. Further, the second substrate 100b can define a recess 128a in the first surface 111 of the second substrate 100b. The second substrate 100b can further define a middle through hole 120c that extends from the recessed surface 113 of the first surface 111 in the recess 113 to the second surface 112. The through-holes 120a and 120b, the blind hole 120c, and the recess 128a can be constructed in the manner set forth herein. For instance, respective regions of the substrates 100a and 100b can be irradiated and etched so as to define the through-holes 120a and 120b, the middle through hole 120c, and the recess 128a.

Figure 13C:
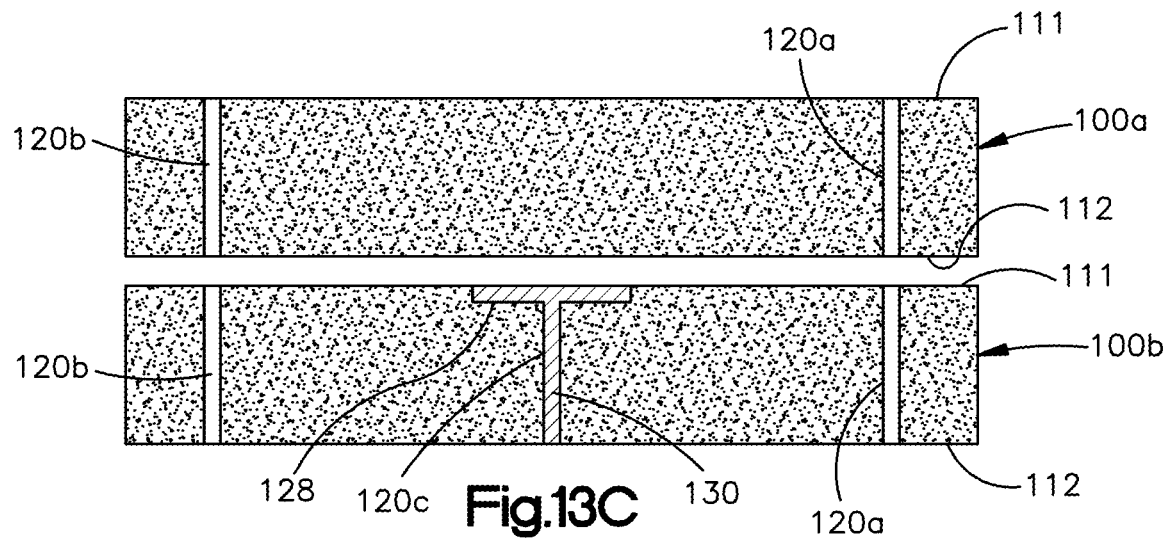
FIG. 13C is a schematic sectional side elevation view the first and second substrates illustrated in FIG. 13B, showing a middle through-hole and recess of the second substrate metalized.

Next, as illustrated in FIG. 13C, the middle through-hole 120c and the recess 128a can be metallized in the manner described herein. The recess 128a can be metalized such that the conductive material in the recess 128a can be substantially planar with the first surface 111 of the second substrate 100b. As illustrated at FIG. 13D, the first and second substrates 100a and 100b can be attached to each other. In particular, the second surface 112 of the first substrate 100a can be attached to the first surface 111 of the second substrate 100b. For instance, the first and second substrates 100a and 110b can be joined at respective interfaces by one or more weld seams 154. Alternatively, the first and second substrates 100a and 100b can be joined at respective interfaces by any suitable attachment as desired. When the first and second substrates 100a and 100b are attached to each other, the first through-holes 120a of the first and second are aligned with each other and continuous with each other so as to define the first through-hole 120a of the system 150. Further, when the first and second substrates 100a and 100b are attached to each other, the second through-holes 120b of the first and second are aligned with each other and continuous with each other so as to define the second through-hole 120b of the system 150. Further, when the first and second substrates 100a and 100b are attached to each other, the middle through-hole 120c of the second substrate 100b can define a blind hole can terminate at the first substrate 100a, and can thus define the blind hole 120c of the system 150. Further, the recess 128a of the second substrate 100b can define the buried channel 126a of the system 150.

Next, as illustrated in FIG. 13E, the first and second through-holes 120a and 120b of the system 150 can be metallized in the manner described herein. Thus, it should be appreciated that the first and second through-holes 120a and 120b of the system 150 can be metallized after the first and second substrates 100a and 100b have been attached to each other. Alternatively, each of the first and second through-holes 120a and 120b of the respective substrates 100a and 100b can be metalized prior to attaching the first and second substrates 100a and 100b to each other. Finally, as illustrated in FIG. 13A, the redistribution layers 140a and 140b can be applied to the first and second surfaces 111 and 112 of the first and second substrates 100a and 100b in any manner described herein. It should be appreciated that the redistribution layers 140a and 140b can be applied to the first and second surfaces 111 and 112 prior to metallization of the through-holes 120a and 120b or after metallization of the through-holes 120a and 120b. Further, the redistribution layers 140a and 140b can be applied to the first and second surfaces 111 and 112 prior to attachment of the first and second substrates 100a and 100b to each other or after attachment of the first and second substrates 100a and 100b to each other.

Referring now to FIG. 13F, while the system 150 can include first and second substrates 100a and 100b that are attached to each other in the manner described above, the system 150 can alternatively include a single homogenous monolithic substrate 100 that defines each of the first and second surfaces 111 and 112. Thus, it can be said that the system 150 can include at least one substrate 100 that defines the first and second surfaces 111 and 112. The through-holes 120a and 120b, the blind hole 120c, and the buried channel 126a of the homogenous monolithic substrate 100 can be constructed in the manner set forth herein. For instance, the respective regions of the substrate 100 can be irradiated and etched so as to define the through-holes 120a and 120b, the blind hole 120c, the buried channel 126a. The through-holes 120a and 120b, the blind hole 120c, the buried channel 126a can then be metalized in the manner described herein. The redistribution layers 140a and 140b can be applied to the first and second surfaces 111 and 112 of the homogeneous monolithic substrate 100 in any manner described herein.

It should be appreciated from the description above that the passages described herein can define a conductive component having one or more conduits that include any desired number and types of passages arranged as desired. One or more of the conduits can include a plurality of openings in the same or different ones of the external surfaces of the substrate, and the openings can be in electrical communication with each other. One or more of the openings such as a plurality of the openings can be defined in the first surface. Alternatively or additionally, the conduit can define a plurality of openings in the second surface. The second surface can be spaced from the first surface and opposite the first surface along the first direction. Alternatively, the second surface can be spaced from the first surface and opposite the first surface along the second direction. In this regard, the first and second surfaces can define side surfaces. The conduits can include at least one or more holes such as a plurality of holes. Alternatively or additionally, the conduits can include at least one or more channels such as a plurality of channels. The at least one or more channels can be in electrical communication with the at least one or more holes. Similarly, the at least one or more holes can be in electrical communication with the at least one or more channels.

EXAMPLES

Example 1

As a non-limiting example, a $CO_2$ laser is used to drill through holes in a glass substrate.

Example 2

The following is a non-limiting example of filling a through-hole in a glass substrate. A thick film paste is used to fill the through hole. The paste is dried at or below 150 degrees C. in air, nitrogen, doped nitrogen, $CO/CO_2$ or vacuum. The filled through hole is then fired up to 815° C., or below the softening point of the glass substrate. This process can be repeated several times depending on through hole dimensions. In some embodiments, firing above the softening point of the glass substrate (above 815° C. for borosilicate type glass) without a support can cause the glass substrate to warp, and/or the glass substrate can conform to a desired shape, which may be useful in specialized applications.

Example 3

The following is a non-limiting example. A method of processing a glass substrate for use in semi-conductor applications: The glass substrate with conductive through holes is metallized on both surfaces. Multiple layers, such as redistribution layers can be used based on the application. In one embodiment, integrated circuits and components are attached on one side, and a motherboard (PWB or other) is attached on the other side.

Example 4

Non-limiting example of a Paste Material—Organic vehicles based on ethyl cellulose or other resin systems; solvents including terpineol, dowanol, texanol and other solvent systems typically used in the thick film industry; glass frit compositions; copper powders and their oxides.

Example 5

Non-limiting example of a Final Product—Either thick film metallization (by itself or + plating), or thin film metallization with adhesion layer, barrier, conductor, barrier and ENIG or ENIPIG.

The disclosures of the following U.S. Patents are incorporated in their entirety by reference herein: U.S. Pat. No. 8,584,354, U.S. 2013/0105211, WO2013138452, WO2012061304, U.S. Pat. No. 8,411,459, and U.S. 2013/0119555.

Various modifications of the disclosure, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present disclosure, it will be readily apparent to those skilled in the art that modifications may be made thereto which do not exceed the scope of the appended claims. Therefore, the scope of the disclosure is only to be limited by the following claims. Reference numbers recited in the claims are exemplary and for ease of review by the patent office only, and are not limiting in any way. In some embodiments, the figures presented in this patent application are drawn to scale, including the angles, ratios of dimensions, etc. In some embodiments, the figures are representative only and the claims are not limited by the dimensions of the figures. In some embodiments, descriptions of the disclosures described herein using the phrase "comprising" includes embodiments that could be described as "consisting of", and as such the written description requirement for claiming one or more embodiments of the present disclosure using the phrase "consisting of" is met.

The reference numbers recited in the below claims are solely for ease of examination of this patent application, and are exemplary, and are not intended in any way to limit the scope of the claims to the particular features having the corresponding reference numbers in the drawings.

The invention claimed is:

1. A method of fabricating a conductive component, the method comprising the steps of;
   irradiating a first region of a substrate from substantially one of an external first surface and an opposite external second surface of a substrate toward the other of the first and second surfaces to an end of the first region, wherein the first and second surfaces are spaced from each other along a transverse direction;
   irradiating a second region that extends from the first region along a second direction that is angled with respect to the transverse direction;
   etching the irradiated first region such that glass is removed from the first region, thereby creating at least one first passage;
   etching the irradiated second region so as to remove the glass from the second region, so as to define a second passage; and
   metallizing the at least one passage with a lead-free electrically conductive material, wherein the metallizing step further comprises metallizing the first and second passages such that the lead-free electrically conductive material extends continuously from the at least one first passage to the second passage.

2. The method as recited in claim 1, further comprising the step of applying an adhesion promoter to an inner side wall of the substrate in each of the passages, and the metallizing step comprises electroplating the conductive material to the adhesion promoter.

3. The method as recited in claim 1, further comprising sintering the conductive material while the conductive material is disposed in each of the passages.

4. The method as recited in claim 1, wherein the etching step comprises etching the first and second regions with an etchant selected from the group consisting of a potassium hydroxide and a hydrofluoric acid.

5. The method as recited in claim 1, wherein the lead-free electrically conductive material is a thermally conductive material.

6. The method as recited in claim 1, wherein the conductive material is electrically conductive.

7. The method as recited in claim 1, wherein the substrate is lead-free.

8. The method as recited in claim 1, further comprising selecting the at least one conductive material comprising a first electrically conductive material having electrically conductive particles and a second electrically conductive material having second electrically conductive particles D50 particle sizes different than those of the first electrically conductive material.

9. The method as recited in claim 8, wherein the D50 particle sizes of the second electrically conductive particles are smaller than those of the first electrically conductive particles.

10. The method as recited in claim 8, wherein each of the first and second electrically conductive materials are lead-free.

11. The method as recited in claim 8, wherein the first electrically conductive material comprises a first carrier and first electrically conductive particles, the second electrically conductive material comprises a second carrier and second electrically conductive particles, the first electrically conductive particles define a first average outer area, the second electrically conductive particles define a second average outer area that is less than the first average outer area.

12. The method as recited in claim 1, wherein the lead-free electrically conductive material comprises a metallic powder having particle whose average maximum cross-sectional dimensions range from about 10 nanometers to about 24 microns, the method further comprising the step of selecting the particles from a group consisting of at least one of copper, gold, silver, palladium, platinum, nickel, aluminum, oxides thereof, alloys thereof, and mixtures thereof.

13. The method as recited in claim 12, further comprising the step of mixing metallic particles, a glass frit composition, a solvent, an inert additive, and a resin to form the electrically conductive material configured as a paste.

14. A method of metallizing at least one passage that extends at least into a glass substrate and is defined by an internal wall of the glass substrate, the method comprising the steps of:
   applying a plurality of electrically conductive metal particles carried by a carrier to the substrate in the at least one passage under vacuum pressure;

after the applying step, applying isostatic pressure to the glass substrate; and sintering the metal particles in the at least one passage.

15. The method as recited in claim 14, further comprising repeating the steps of applying the plurality of electrically conductive metal particles and applying isostatic pressure.

16. The method as recited in claim 14, wherein the metal particles comprise silver particles.

17. The method as recited in claim 16, wherein the metal particles are lead-free particles.

18. The method as recited in claim 14, wherein the electrically conductive particles have particle sizes ranging from about 10 nanometers to about 24 microns.

19. The method as recited in claim 14, further comprising the step of applying a second plurality of electrically conductive metal particles carried by the carrier to the substrate in the at least one passage under vacuum pressure, wherein the electrically conductive particles of the second plurality of electrically conductive metal particles have a higher density in the carrier than the previously applied plurality of electrically conductive particles.

* * * * *